United States Patent [19]

Terashima

[11] Patent Number: 5,428,241
[45] Date of Patent: Jun. 27, 1995

[54] HIGH BREAKDOWN VOLTAGE TYPE SEMICONDUCTOR DEVICE

[75] Inventor: Tomohide Terashima, Hyogo, Japan

[73] Assignee: Mitsubishi Denki Kabushiki Kaisha, Tokyo, Japan

[21] Appl. No.: 273,685

[22] Filed: Jul. 12, 1994

[30] Foreign Application Priority Data

Jul. 16, 1993 [JP] Japan .................................. 5-177059
Dec. 27, 1993 [JP] Japan .................................. 5-333077

[51] Int. Cl.6 .......................................... H01L 27/02
[52] U.S. Cl. ................................... 257/409; 257/336; 257/347
[58] Field of Search ............... 257/336, 339, 343, 347, 257/401, 409

[56] References Cited

PUBLICATIONS

"A Versatile 250/300-V IC Process For Analog And Switching Applications", Ludikhuize, IEEE Transaction on Electron Devices, vol. Eb-33, pp. 2008-2015.
"A Versatile 700-1200-V IC Process For Analog And Switching Applications", ludikhuize, IEEE Transaction on Electron Devices, vol. 38, pp. 1582-1589.
"Structure of 600V IC and A New Voltage Sensing Device", Terashima et al., Proceedings of the 5th International Symposium on Power Semiconductor Devices on ICs, ISPSD'93, pp.224-229.

Primary Examiner—Mark V. Prenty
Attorney, Agent, or Firm—Lowe, Price, LeBlanc & Becker

[57] ABSTRACT

In a high breakdown voltage type semiconductor device, width W2 of channel region 20 at a corner portion is made wider than width W1 of channel region 20 at a linear portion in a planar pattern of a gate electrode 9. Consequently, the device has high breakdown voltage when it is "OFF" and has low resistance when it is "ON".

6 Claims, 38 Drawing Sheets

HIGH BREAKDOWN VOLTAGE TYPE SEMICONDUCTOR DEVICE

BACKGROUND OF THE INVENTION

Field of the Invention

The present invention relates to a high breakdown voltage type semiconductor device and, more specifically, to a high breakdown voltage type semiconductor device having improved structure enabling higher performance.

Description of the Background Art

Recently, high breakdown voltage type semiconductor devices as well as bipolar transistors and thyristors have been noted as power switching devices, since the high breakdown voltage type device has such advantages as fast switching speed, wide safe operating area and readiness to parallel operations.

A high breakdown voltage type semiconductor device is disclosed, for example, in *IEEE TRANSACTION ON ELECTRON DEVICES*, Vol. Eb-33 No. Dec. 12, 1986 pp. 2008–2015.

Structure and operation of a conventional high breakdown voltage type semiconductor device will be described with reference to FIG. 45. First, an $n^-$ epitaxial layer 2 is formed on a $p^-$ semiconductor substrate 1. On a prescribed region on the surface of $n^-$ epitaxial layer 2, a $p^-$ impurity region 5 is formed. On one side of $p^-$ type impurity region 5, a p type source region 3 is provided with a prescribed distance for providing a channel region 20. On that side of source region 3 which is opposite to channel region 20, an n type impurity region 4 is formed in contact with the source region 3.

Above channel region 20, a gate electrode 9 is provided with a gate oxide film 21 interposed therebetween. On source region 3, n type impurity region 4, $n^-$ epitaxial layer 2 and gate electrode 9, a source electrode 11 is formed. Between $n^-$ epitaxial layer 2 and source electrode 11 and between gate electrode 9 and source electrode 11, an oxide film 10 is interposed. Meanwhile, on the other side of $p^-$ impurity region 5, a p type drain region 6 is formed in contact with $p^-$ impurity region 5. On p type drain region 6 and $n^-$ epitaxial layer 2, a drain electrode 12 is formed, with oxide film 10 interposed between $n^-$ epitaxial layer 2 and drain electrode 12.

On the side of drain region 6 opposing to $p^-$ type impurity region 5, there is formed a p type isolating region 7 extending from the surface of $n^-$ epitaxial layer 2 to the surface of $p^-$ semiconductor substrate 1. At the interface between $n^-$ epitaxial layer 2 and $p^-$ semiconductor substrate 1 below gate electrode 9, source region 3 and n type impurity region 4, an $n^+$ type buried layer 8 is +formed. Further, on the rear side of $p^-$ semiconductor substrate 1, there is provided a substrate electrode 13.

The principle of operation of the high breakdown voltage type semiconductor device having the above structure will be described with reference to FIGS. 46 to 48. First, referring to FIG. 46, drain electrode 12 and substrate electrode 13 are set to 0 V. Gate electrode 9 and source electrode 11 are short circuited, and a voltage of $+V$ is applied thereto.

At this time, a depletion layer generated in the semiconductor substrate extends from a junction B between $n^-$ epitaxial layer 2 and $p^-$ semiconductor substrate 1, a junction A between $n^-$ epitaxial layer 2 and p type isolation region 7, and a junction C between epitaxial layer 2 and $p^-$ impurity region 5. Depletion layer a extending from junction A tends to extend easily because of the influence of depletion layer b extending from junction B. Accordingly, the electric field at junction A can be kept at a relatively small value. This effect is generally called a RESURF (REduced SURface Field) effect.

As to the depletion layer c extending from junction C, it extends to the side of $n^-$ epitaxial layer 2 while depleting $p^-$ impurity region 5, as the impurity concentration of $p^-$ impurity region 5 is low. Source electrode 11 and gate electrode 9 formed overlapping above a part of $p^-$ impurity region 5 provides two field plates, which promote depletion of $p-$ impurity region 5 and relax field concentration of junction C near gate electrode 9.

Thereafter, referring to FIG. 48, when the voltage $+V$ is increased, the breakdown voltage is finally determined by the junction between $n^+$ buried layer 8 and $p^-$ semiconductor substrate 1. At this time, $n^-$ epitaxial layer 2 and $p^-$ impurity region 5 are almost depleted as shown in FIG. 47. In this state, semiconductor device can be kept "OFF".

Referring to FIG. 48, assume that the potential at gate electrode 9 is made lower with respect to source electrode 11. At this time, channel region 20 immediately below gate electrode 9 is inverted, and hole current flows in the direction of the arrow in the figure, from source region 3 through $p^-$ impurity region 5 to drain region 6. Consequently, the semiconductor device can be kept "ON". As described above, most of the resistance in the semiconductor device when it is "ON" is the impurity diffusion resistance of $p^-$ impurity region 5. Therefore, in order to set the semiconductor device "ON" with low resistance, $p^-$ impurity region 5 should desirably have low resistance. However, in order to provide high breakdown voltage, the $p^-$ impurity region 5 must be depleted in "OFF" state, and for this purpose, $p^-$ impurity region 5 should have relatively high impurity concentration.

A structure satisfying these incompatible demands is disclosed, for example, in *Proceedings of The 5th International Symposium on Power Semiconductor Devices and ICS, EXPSD' 93.* pp. 224–229.

The structure of this semiconductor device will be described with reference to FIG. 49. Compared with the device shown in FIG. 45, this semiconductor device has similar structure except that a field oxide film 14 is provided on the upper surface of $p^-$ impurity region 5.

The principle of operation of the semiconductor device having the above structure will be described with reference to FIGS. 50 to 52. First, referring to FIG. 50, drain electrode 12 and substrate electrode 13 are set to 0 V. Gate electrode 9 and source electrode are short circuited, and a voltage of $+V$ is applied thereto. The depletion layer generated in the semiconductor device at this time extends from the junction B between $n^-$ epitaxial layer 2 and $p^-$ semiconductor substrate 1, junction A between $n^-$ epitaxial layer 2 and p type isolation region 7, and junction C between $n^-$ epitaxial layer 2 and $p^-$ impurity region 5. Depletion layer a extending from junction A apts to extend more because of the influence of depletion layer b extending from junction B due to the aforementioned RESURF effect, and the electric field at junction A is kept at a relatively small value.

Meanwhile, depletion layer c extending from junction C extends to the side of n⁻ epitaxial layer 2 while depleting p⁻ impurity region 5 simultaneously, as p⁻ impurity region 5 has low concentration. Further, since p⁻ impurity region 5 is formed simultaneously with oxidation of field oxide film 14, the surface concentration of p⁻ impurity region 5 has been lowered because of segregation. Therefore, even if the resistance value of p⁻ impurity region 5 is similar to the above described conventional example, it is more likely depleted. Further, the gate electrode 9 formed overlapping field oxide film 14 provides a field plate. The distance between gate electrode 9 and p⁻ impurity region 5 increases moderately. Therefore, it promote depletion of p⁻ impurity region 5 and effectively relaxes field concentration of junction C near gate electrode 9.

When the voltage +V is further increased, referring to FIG. 51, finally, the breakdown voltage is determined by the junction between n+ buried layer 8 and p⁻ semiconductor substrate 1. At this time, n⁻ epitaxial layer 2 and p⁻ impurity region 5 are almost depleted. In this state, the semiconductor device can be kept "OFF".

Then, referring to FIG. 52, when the potential at gate electrode 9 is lowered with respect to source electrode 11, channel region 20 immediately below the gate electrode is inverted, and hole current flows in the direction of the arrow in the figure, from source region 3 through p⁻ impurity region 5 to drain region 6. Consequently, the semiconductor device can be kept "ON".

The method of manufacturing the semiconductor device having the above structure will be described with reference to FIGS. 53 to 61. Referring to FIG. 53, antimony is introduced to a prescribed region of p⁻ semiconductor substrate 1, annealing is effected, and thus n+ buried layer 8 is formed. Then, n⁻ epitaxial layer 2 is formed on the surface of p⁻ semiconductor substrate 1 by epitaxial growth.

Referring to FIG. 54, an oxide film 21 is formed on the surface of n⁻ epitaxial layer 2 and is patterned such that its thickness is reduced at a prescribed region only. Thereafter, by using oxide film 21 as a mask, boron is introduced to p⁻ semiconductor substrate 1 and annealed, so as to form a p type isolation region 7. Then, referring to FIG. 55, oxide film 21 is removed, an oxide film 22 is again formed on n⁻ epitaxial layer 2, and a nitride film 23 is formed on oxide film 22. After, a resist film 24 having a prescribed pattern is formed on nitride film 23, and nitride film 23 is patterned by using resist film 24 as a mask.

Thereafter, using resist film 24 and oxide film 23 as a mask, boron is introduced to n⁻ epitaxial layer 2. Referring to FIG. 56, resist film 24 is removed, and thereafter, selective oxidation is effected using nitride film 23 as a mask, and thus field oxide film 14 is formed. At this time, p⁻ impurity region 5 is simultaneously formed at a region below the field oxide film 14. Then, nitride film 23 and oxide film 22 are removed.

Then, referring to FIG. 57, an oxide film 21 and a polycrystalline silicon layer 9 are formed on the surface of n⁻ epitaxial layer 2. Thereafter, resist film 25 having a prescribed shape is formed on the polycrystalline silicon layer 9, polycrystalline silicon film 9 is patterned using resist film 25 as a mask, and thus a gate electrode 9 is formed.

Then, referring to FIG. 58, a resist film having a prescribed pattern is formed on n⁻ epitaxial layer 2. By using resist film 26 as a mask, boron is introduced to a prescribed region of n⁻ epitaxial layer 2. Referring to FIG. 59, resist film 26 is removed, then, source region 3 and drain region 4 are formed by annealing, and then an oxide film 10 is formed to cover gate electrode 9. Then, referring to FIG. 60, a region of oxide film 10 which is adjacent to source region 3 is patterned, phosphorus is introduced, and then annealing is effected to form an n type impurity region 4.

Thereafter, referring to FIG. 61, oxide film 10 is again deposited on the entire surface of n⁻ epitaxial layer 2. Thereafter, contact holes raising source region 3 and drain region 6 are opened in oxide film 10, Al—Si is deposited by sputtering, and then patterning is effected by etching, so that a source electrode 11 and a drain electrode 12 are formed. Thereafter, metal deposition is performed on the rear surface of p⁻ semiconductor substrate 1, so as to form a substrate electrode 13. Through the above described steps, a high breakdown voltage type semiconductor device of FIG. 50 is completed.

However, the high breakdown voltage type semiconductor device having the above described structure and the method of manufacturing have the following problems. First, referring to FIG. 62, depletion layers extend differently at a corner portion of the planar pattern of channel region 20 as compared with the linear portion. The manner of extension of the depletion layers a, b and c at the corner portion will be described with reference to FIG. 63, which is a cross section taken along the line X—X of FIG. 62.

Because of the effect provided by the shape at the corner portion, depletion layers a, b and c extend more easily toward source region 3, while depletion layer c near p⁻ impurity region 5 does not much extend. Therefore, at the corner portion, it is likely that punch through phenomenon occurs between source region 3 and p⁻ impurity region 5 as the depletion layer extends to source region 3. Further, in the conventional structure described above, depletion of p⁻ impurity region 5 is promoted. However, the resistance of the semiconductor device when it is "ON" is not changed, so that much power has been consumed.

SUMMARY OF THE INVENTION

An object of the present invention is to provide a high breakdown voltage type semiconductor device which provides high breakdown voltage when it is "OFF" and which can operate with low resistance when it is "ON" by improving structure of the high breakdown voltage type semiconductor device.

According to one aspect, the above-described object of the present invention is attained by a high breakdown voltage type semiconductor device including a semiconductor layer of a first conductivity type; a low concentration impurity region of a second conductivity type formed at a prescribed position of the semiconductor layer; a first main electrode region of a second conductivity type formed spaced apart by a prescribed distance from an end portion of the low concentration impurity region of the second conductivity type so as to provide a channel region, on one side of the low concentration impurity region of the second conductivity type; a control electrode formed above the channel region on the semiconductor layer with an insulating film therebetween and extending over a part of an upper surface of the low concentration impurity region of the second conductivity type; an impurity region of a first conductivity type formed on the surface of the semiconductor layer to be in contact with the first main electrode region, on a region opposite to the channel region of the first main electrode region; a first main electrode formed on the semiconductor layer and the control electrode with an insulating film interposed therebetween, and on the first main electrode and the impurity region of the first conductivity type; a second main electrode region of a second conductivity type formed in contact with the low concentration impurity region of the second conductivity type on the other side of the low concentration impurity region of the second conductivity type at the surface of the semiconductor layer; and a second main electrode formed on the semiconductor layer with an insulating film interposed therebetween and on the second main electrode region.

As to the width of the channel region, the width of the channel region at the corner portion is made wider than that at the linear portion, with respect to the planar pattern of the control electrode. Preferably, the low concentration impurity region of the second conductivity type is formed to be in contact with a region at the lower surface of the field insulating film formed at the surface of the semiconductor layer. More preferably, the impurity region of the first conductivity type is formed to cover the first main electrode region.

Accordingly, extension of the depletion layer toward the first electrode region at the corner portion can be suppressed. As a result, punch through phenomenon between the first main electrode region and the impurity region of the second conductivity type can be prevented. Further, depletion of the semiconductor layer of the first conductivity type can be promoted. Therefore, a high breakdown voltage type semiconductor device having high breakdown voltage when it is "ON" can be implemented.

According to another aspect, the above described object of the present invention is attained by a high breakdown voltage type semiconductor device including a semiconductor layer of a first conductivity type; a low concentration impurity region of a second conductivity type formed at a prescribed position of the semiconductor layer; a first main electrode region of a second conductivity type formed on one side of the low concentration impurity region of the second conductivity type at the surface of the semiconductor layer, with a prescribed distance from an end portion of the low concentration impurity region of the second conductivity type so as to provide a channel region; a control electrode formed above the channel region, on the surface of the semiconductor layer with an insulating film therebetween, and extending over a part of an upper surface of the low concentration impurity region of the second conductivity type; an impurity region of a first conductivity type formed on a region opposite to the channel region of the first main electrode region, to be in contact with the first main electrode region, on the surface of the semiconductor layer; a first main electrode formed on the semiconductor layer and the control electrode with an insulating film interposed therebetween, and on the first main electrode and the impurity region of the first conductivity type; a second main electrode region formed on the other side of the low concentration impurity region of the second conductivity type at the surface of the semiconductor layer to be in contact with the low concentration impurity region of the second conductivity type; an impurity diffused region of the first conductivity type formed in the second main electrode region; and a second main electrode formed on the semiconductor layer and on the second main electrode region with an insulating film therebetween, and on the impurity diffused region.

Preferably, the low concentration impurity region of the second conductivity type is formed to be in contact with a region at the lower surface of a field insulating film formed at the surface of the semiconductor layer.

According to this aspect, in the high breakdown voltage semiconductor device, the impurity diffused region of the first conductivity type is formed in the second main electrode region. Further, the second main electrode region is connected to the impurity diffused region of the first conductivity type.

Consequently, hole current which has reached the second main electrode region is introduced to the impurity diffused region of the first conductivity type. As a result, electron current flows from the impurity diffused region of the first conductivity type to the semiconductor layer of the first conductivity type through the second main electrode region. Accordingly, the high breakdown voltage type semiconductor device turns "ON" with the hole current and the electron current flowing simultaneously between the first main electrode and the second main electrode, which leads to significant reduction in resistance when the device is "ON".

According to still another aspect, the above described object can be attained by a high breakdown voltage type semiconductor device including a semiconductor layer of a first conductivity type; a low concentration impurity region of a second conductivity type formed at a prescribed position of the semiconductor layer; a first main electrode region of a second conductivity type formed on one side of the low concentration impurity region of the second conductivity type at the surface of the semiconductor layer with a prescribed distance from an end portion of the low concentration impurity region of the second conductivity type so as to provide a channel region; a control electrode formed above the channel region on a surface of the semiconductor layer with an insulating film therebetween and extending over a part of an upper surface of the low concentration impurity region of the second conductivity type; an impurity region of a first conductivity type formed at a region opposite to the channel region of the first main electrode region, on the semiconductor layer to be in contact with the first main electrode region; a first main electrode formed on the semiconductor layer and the control electrode with an insulating film interposed therebetween, and on the first main electrode and the impurity region of the first conductivity type; a second main electrode region formed on the other side of the low concentration impurity region of the second conductivity type at the surface of the semiconductor layer to be in contact with the low concentration impurity region of the second conductivity type; an impurity diffused region of a first conductivity type formed in the second main electrode region; and a second main electrode formed on the semiconductor layer with an insulating film therebetween and on the second main electrode region and the impurity diffused region.

Preferably, the low concentration impurity region of the second conductivity type is formed to be in contact with a region at the lower surface of a field insulating film formed at the surface of the semiconductor layer.

According to this aspect, in the high breakdown voltage type semiconductor device, the impurity diffused region of the first conductivity type is formed in the second main electrode region, and the second main electrode is connected to the second main electrode region and the impurity diffused region of the first conductivity type.

Consequently, hole current flows into the second main electrode region. The hole current reaching the second main electrode region flows to the second main electrode region through a pinch resistance portion formed below the impurity diffused region of the first conductivity type. Therefore, when the hole current exceeds a prescribed amount, a forward bias is generated between the second main electrode region and the impurity diffused region of the first conductivity type, because of a voltage drop generated at the pinch resistance.

As a result, electron current starts to flow from the impurity diffused region of the first conductivity type to the semiconductor layer of the first conductivity type through the second main electrode region. Since the device turns "ON" with the hole current and the electron current flowing simultaneously between the second main electrode and the first main electrode, the resistance when the device is "ON" can be significantly reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
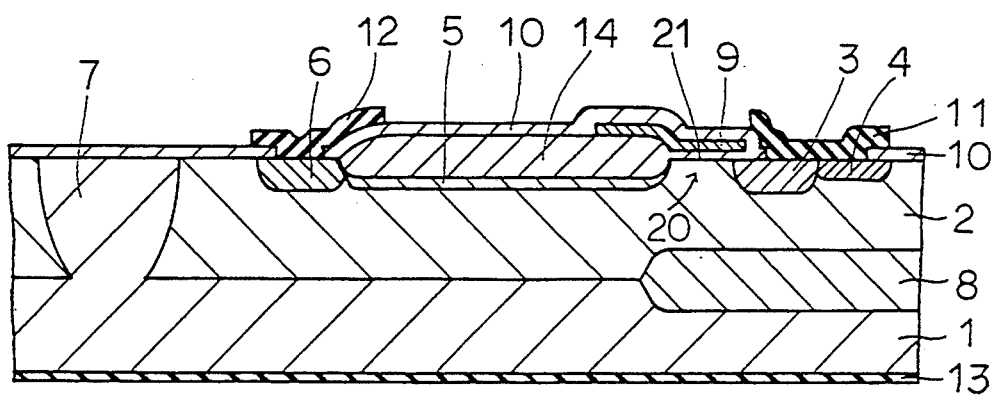
FIG. 1 is a cross section showing a structure of a high breakdown voltage type semiconductor device in accordance with a first embodiment of the present invention.

In the following, a first embodiment of the present invention will be described. First, referring to FIG. 1, am $n^-$ epitaxial layer 2 is formed on a $p^-$ semiconductor substrate 1. At a prescribed region at the surface of $n^-$ epitaxial layer 2, a $p^-$ impurity region 5 is formed. On one end side of $p^-$ impurity region 5, a p type source region 3 is formed with a prescribed distance, so as to provide a channel region 20. On the side of source region 3 opposite to channel region 20, an n impurity region 4 is formed in contact with source region 3.

Above channel region 20, a gate electrode 9 is formed with a gate oxide film 21 interposed therebetween. On source region 3 and n type impurity region 4, and on the $n^-$ epitaxial layer 2 and gate electrode 21 a source electrode 11 is provided, with an oxide film 10 interposed between the source electrode and each of $n^-$ epitaxial layer 2 and gate electrode 21. Meanwhile, on the other side of $p^-$ impurity region 5, a p type drain region 6 is formed in contact with $p^-$ impurity region 5. On p type drain region 6 and on $n^-$ epitaxial layer 2, a drain electrode 12 is provided. Oxide film 10 is interposed between $n^-$ epitaxial layer 2 and drain electrode 12.

In a region on the side of drain region 6 opposite to $p^-$ impurity region 5, a p type isolating region 7 is formed, which extends from the surface $n^-$ epitaxial layer 2 to the surface of $p^-$ semiconductor substrate 1. At an interface between $n^-$ epitaxial layer 2 and $p^-$ semiconductor substrate 1 below gate electrode 9, source region 3 and n type impurity region 4, an $n^+$ buried layer 8 is formed. On the rear surface of $p^-$ semiconductor substrate 1, a substrate electrode 13 is provided.

Figure 2:
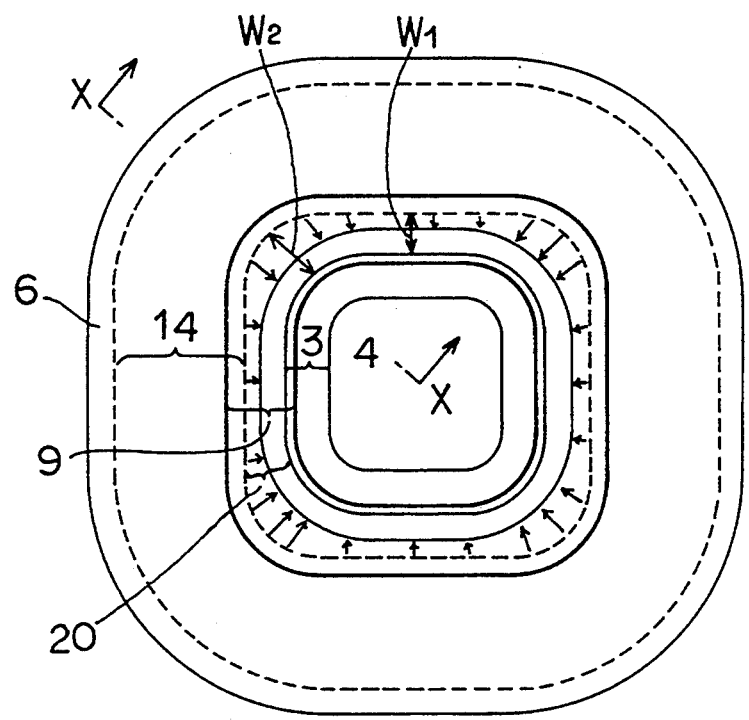
FIG. 2 is a partial plan view of the high breakdown voltage type semiconductor device in accordance with the first embodiment of the present invention.
Figure 3:
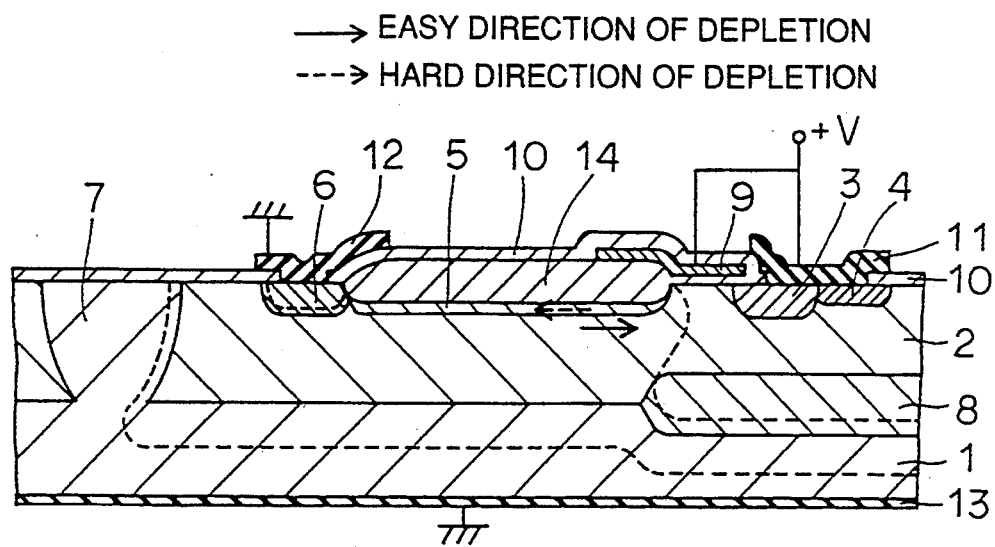
FIG. 3 is a schematic illustration showing the principle of operation of the high breakdown voltage type semiconductor device in accordance with the first embodiment of the present invention.
Figure 4:
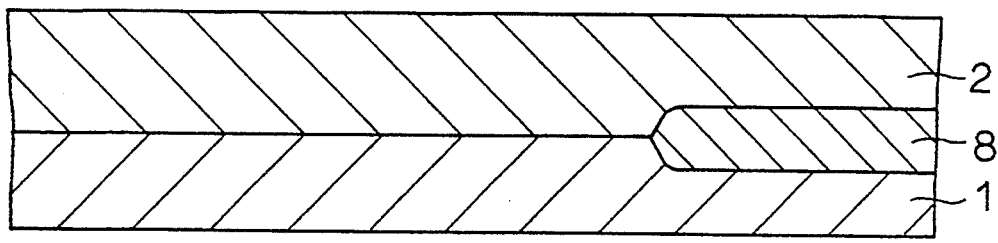
FIGS. 4 to 12 are cross sectional views showing first to ninth steps of manufacturing the high breakdown voltage semiconductor device in accordance with the first embodiment of the present invention.
Figure 5:
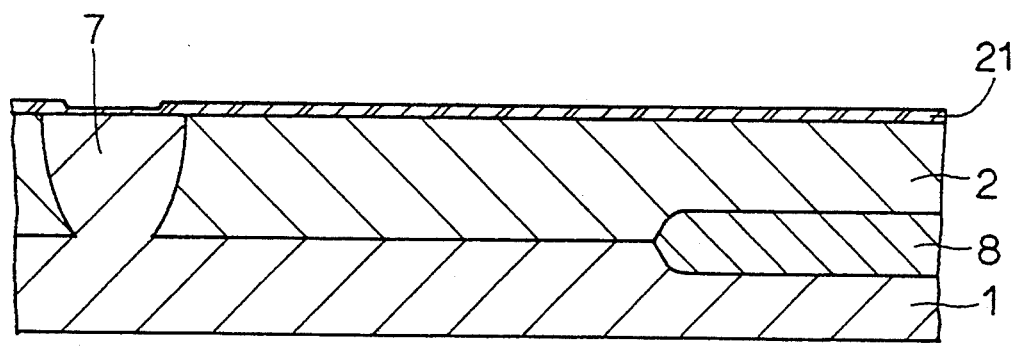

The channel width of the high breakdown voltage type semiconductor device having the above described cross sectional structure will be described with reference to FIG. 2. According to this embodiment, the width W of channel region 20 is such that the width $W_1$ at the linear portion and the width $W_2$ at the corner portion satisfy the relation $W_1 < W_2$. FIG. 3 is a cross section taken along the line X—X of FIG. 2. Referring to FIG. 3, as the width of channel region 20 is set to satisfy $W_1 < W_2$, the distance to the source region 3 can be enlarged, and therefore punch through phenomenon caused by the depletion layer reaching source region 3 can be prevented.

The method of manufacturing the high breakdown voltage type semiconductor device having the above described structure will be described with reference to FIGS. 4 to 12. First, referring to FIG. 4, antimony is introduced or deposited at a prescribed region of $p^-$ semiconductor substrate 1 having the substrate resistance of 30 to 100 cm, annealing is effected, and thus $n^+$ buried layer 8 is formed. Thereafter, on the surface of $p^-$ semiconductor substrate 1, an $n^-$ epitaxial layer 2 having the substrate resistance of 2 to 5 $\Omega$cm and the thickness of 5 to 20 $\mu$m is formed by epitaxial growth. Then, referring to FIG. 5, an oxide film 21 is formed on the surface of $n^-$ epitaxial layer 2, and sputtering is effected to remove the oxide film at prescribed regions. Thereafter, using the oxide film 21 as a mask, boron is introduced to $n^-$ epitaxial layer 2 with the energy of about 670 kV with the dosage of $1 \times 10^{12}$ to $1 \times 10^{13} cm^{-2}$, annealing is effected, and thus p type isolation region 7 is formed.

Figure 6:
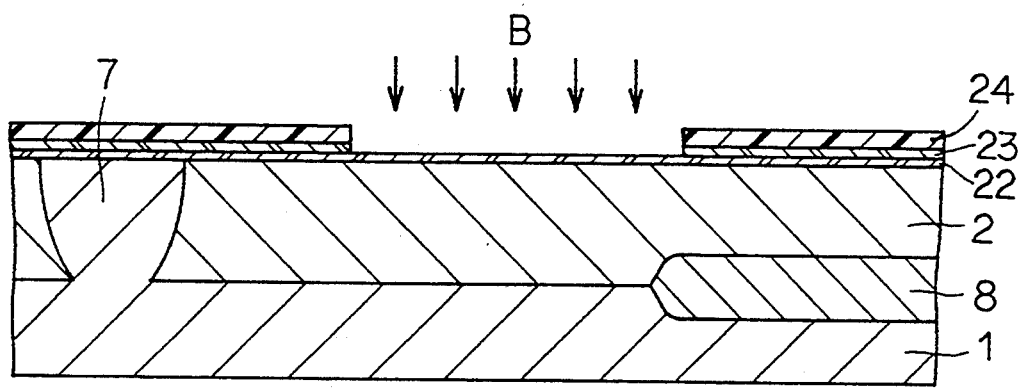

Thereafter, referring to FIG. 6, oxide film 21 is removed, an oxide film 22 is again formed on $n^-$ epitaxial layer 2, and a nitride film 23 is formed on oxide film 22. Thereafter, a resist film 24 having a prescribed pattern is formed on nitride film 23, and nitride film 23 is patterned by using resist film 24 as a mask. By using resist film 24 and nitride film 23 as a mask, boron is introduced to $n^-$ epitaxial layer 2 with the energy of about 50 to 60 kV with the dosage of $1 \times 10^{12}$ to $1 \times 10^{13} cm^{-2}$.

Figure 7:
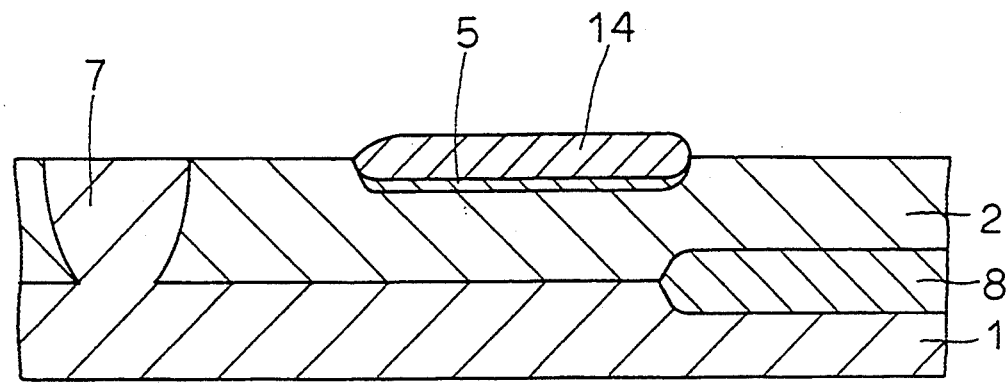

Then, referring to FIG. 7, resist film 24 is removed, and then, using nitride film 23 as a mask, selective oxidation is effected to form a field oxide film 14. At this time, $p^-$ impurity region 5 is formed at a region at the lower surface of field oxide film 14 simultaneously. Thereafter, nitride film 23 and oxide film 22 are removed.

Figure 8:
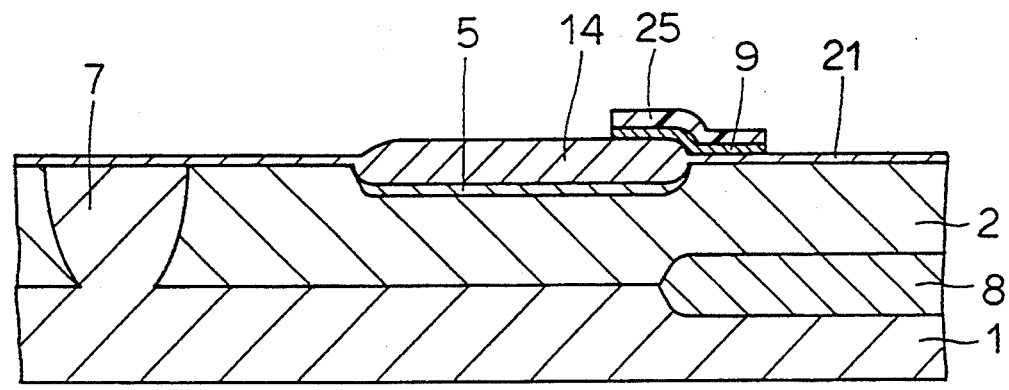
Figure 9:
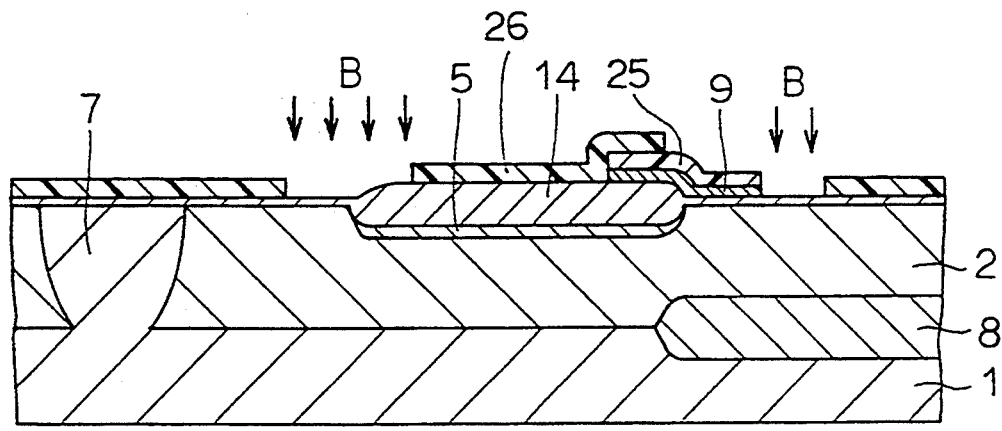

Then, referring to FIG. 8, an oxide film 21 and a polysilicon layer 9 are formed on the surface of $n^-$ epitaxial layer 2. Thereafter, on polysilicon layer 9, a resist film 25 of a prescribed shape is formed, polysilicon layer 9 is patterned by using resist film 25 as a mask, and thus a gate electrode 9 is formed. At this time, when patterning gate electrode 9, the center of the inner radius of curvature is shifted from the center of the outer radius of curvature at the corner portion of the planar shape, so that the channel region, which is formed later, comes to have different width at the corner portion. Thereafter, referring to FIG. 9, a resist film 26 having a prescribed pattern is formed on $n^-$ epitaxial layer 2. Thereafter, using resist film 26 as a mask, boron is introduced to a prescribed region of $n^-$ epitaxial layer 2 with the energy of about 50kV with the dosage of $5 \times 10^{13}$ to $5 \times 10^{15} cm^{-2}$.

Figure 10:
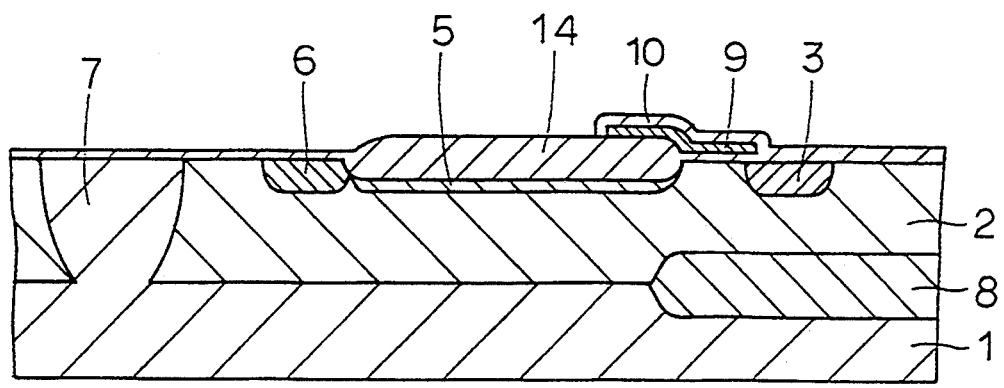
Figure 11:
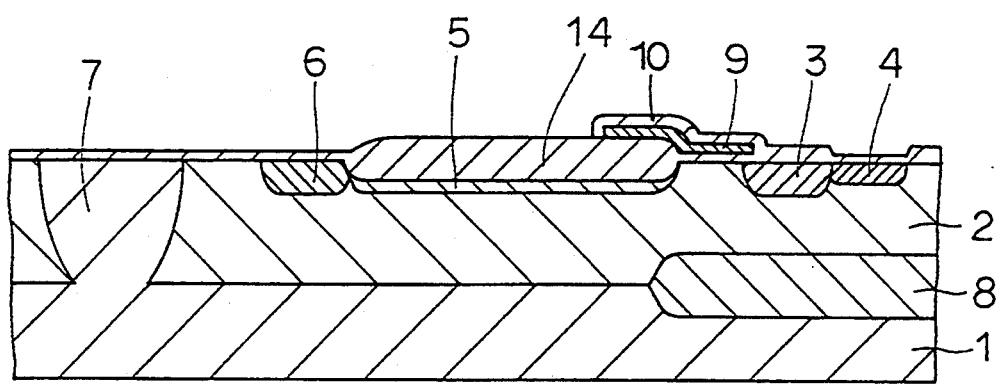
Figure 12:
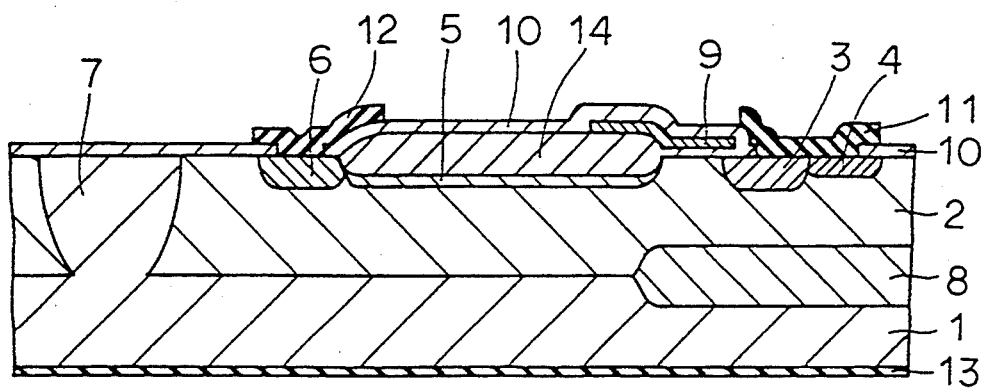

Then, referring to FIG. 10, resist film 26 is removed, and thereafter, by annealing, source region 3 and drain region 6 are formed, and an oxide film 10 is further formed to cover gate electrode 9. Thereafter, referring to FIG. 11, that region of the oxide film which is adjacent to source region 3 is patterned, phosphorus is introduced or deposited, annealing is effected, and thus n type impurity region 4 is formed.

Then, referring to FIG. 12, oxide film 10 is again deposited on the entire surface of $n^-$ epitaxial layer 2. Thereafter, contact holes are provided in oxide film 10 which holds source region 3 and drain region 6, Al—Si is deposited by sputtering, patterning is effected by etching, and thus source electrode 11 and drain electrode 12 are formed. Then, metal deposition is effected on the rear surface of $p^-$ semiconductor substrate 1 to form a substrate electrode 13. Through the above steps, the high breakdown voltage type semiconductor device shown in FIG. 1 is completed.

As described above, by this embodiment, the width of the channel region in the planar pattern of the gate electrode is made such that the width at the linear portion is wider than the width at the corner portion. This prevents extension of depletion layer toward the source region. As a result, punch through phenomenon between the source region and p⁻ impurity region can be prevented.

Figure 13:
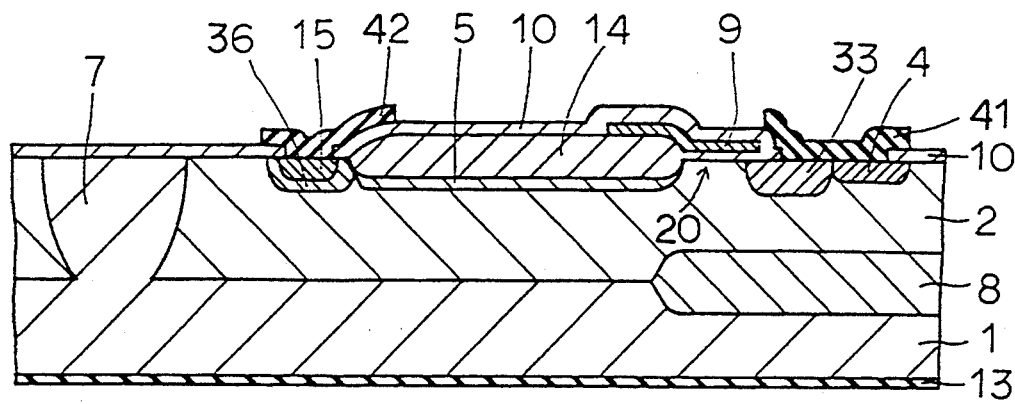
FIG. 13 is a cross sectional view showing a structure of a high breakdown voltage type semiconductor device in accordance with a second embodiment of the present invention.

A second embodiment of the present invention will be described. FIG. 13 is a cross sectional view showing a structure of the high breakdown voltage type semiconductor device in accordance with the second embodiment. Referring to FIG. 13, an n⁻ epitaxial layer 2 is formed on p⁻ semiconductor substrate 1. At a prescribed region on the surface of n⁻ epitaxial layer 2, a field oxide film 14 is formed.

A p⁻ impurity region 5 is formed in contact with the lower surface of field oxide film 14. On the side of one end of field oxide film 14, a p type emitter region 33 is formed with a prescribed distance so as to provide a channel region 20. In a region opposite to channel region 20, an n⁻ type impurity region 4 is formed in contact with emitter region 33.

Above channel region 20, a gate electrode 9 is provided with gate oxide film 21 interposed therebetween. On emitter region 33, n type impurity region 4, n⁻ epitaxial layer 2 and gate electrode 9, an emitter electrode 41 is provided. Between n⁻ epitaxial layer and emitter electrode 41 and between gate electrode 9 and emitter electrode 41, oxide film 10 is interposed.

Meanwhile, on the other side of field oxide film 14, a p type collector region 36 is formed to be in contact with p⁻ impurity region 5. In p type collector region 36, an n type impurity region 15 is formed. On p type collector region 36, n type impurity region 15 and n⁻ epitaxial layer 2, a collector electrode 42 is provided. Between n⁻ epitaxial layer 2 and collector electrode 42, and between p type collector region 36 and collector electrode 42, oxide film 10 is interposed.

On the side of collector region 36 opposite to the field oxide film 14, a p type isolation region 7 is formed extending from the surface of n⁻ epitaxial layer 2 to the surface of p⁻ semiconductor substrate 1. At the interface between n⁻ epitaxial layer 2 and p⁻ semiconductor substrate 1 below emitter region 33 and n type impurity region 4, an n⁺ buried layer 8 is formed. On the rear surface of p⁻ semiconductor substrate 1, a substrate electrode 13 is provided.

Figure 14:
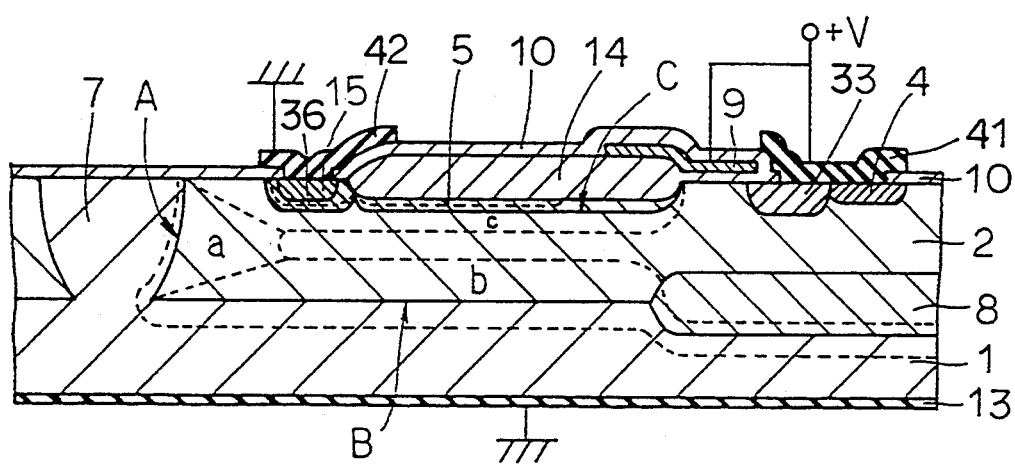
FIG. 14 is a first schematic illustration showing the principle of operation of the high breakdown voltage type semiconductor device in accordance with the second embodiment of the present invention.

The principle of operation of the high breakdown voltage type semiconductor device having the above described structure will be described with reference to FIGS. 14 to 16. First, referring to FIG. 14, the collector electrode 42 and substrate electrode 13 are set to 0 V. Gate electrode 9 and emitter electrode 41 are short-circuited, and a voltage of +V is applied thereto.

At this time, the depletion layer generated in the semiconductor device extends from junction B between n⁻ epitaxial layer 2 and p⁻ semiconductor substrate 1, junction A between n⁻ epitaxial layer 2 and p type isolation region 7 and from junction C between n⁻ epitaxial layer 2 and p impurity region 5. The depletion layer a extending from junction A tends to extend more because of the influence of depletion layer b extending from junction B. For this reason, the electric field at junction A is generally kept at a small value. This effect is generally referred to as RESURF effect.

Meanwhile, depletion layer c extending from junction C extends to the side of n⁻ epitaxial layer 2 and, at the same time, depletes p⁻ impurity region 5, since the concentration of p⁻ impurity region 5 is low. Since p⁻ impurity region 5 is formed simultaneously with oxidation of field oxide film 14, the surface concentration of p⁻ impurity region 5 has been made lower because of segregation. Therefore, even if the resistance of p⁻ impurity region 5 is the same as in the prior art, it can be more easily depleted in accordance with the present embodiment.

The gate electrode 9 formed overlapping the field oxide film 14 constitutes a field plate. Since the distance to p⁻ impurity region 5 from the field plate increases gradually, it promotes depletion of p⁻ impurity region 5, and effectively relaxes the electric field of junction C near gate electrode 9.

Figure 15:
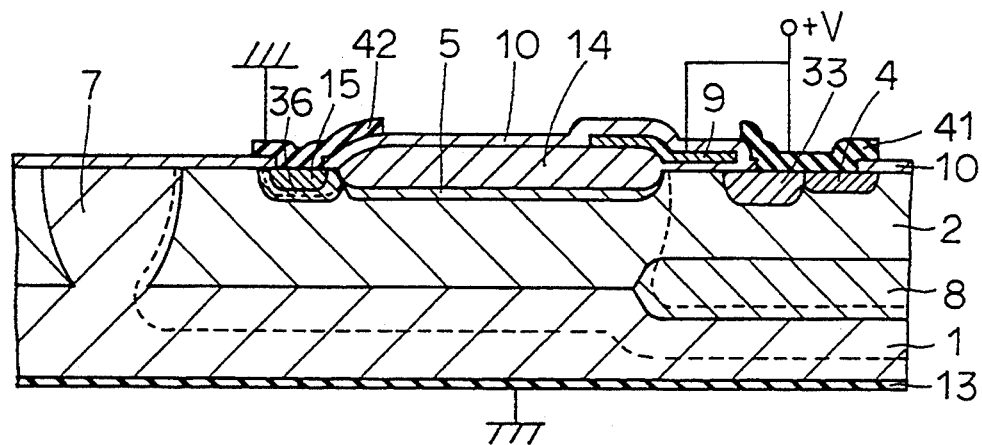
FIG. 15 is a second schematic illustration showing the principle of operation of the high breakdown voltage type semiconductor device in accordance with the second embodiment of the present invention.

Then, referring to FIG. 15, if the voltage +V is further increased, finally, the breakdown voltage is determined by the junction between n⁺ buried layer 8 and p⁻ semiconductor substrate 1. At this time, n⁻ epitaxial layer 2 and p⁻ impurity region 5 are almost depleted. In this state, the semiconductor device can be kept "OFF".

Figure 16:
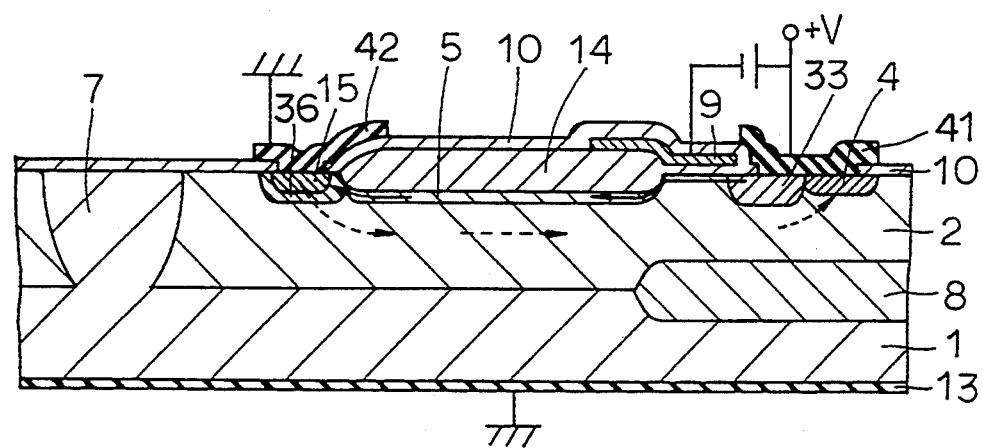
FIG. 16 is a third schematic illustration showing the principle of operation of the high breakdown voltage type semiconductor device in accordance with the second embodiment of the present invention.

Referring to FIG. 16, if the potential at gate electrode 9 is lowered with respect to the emitter electrode 41, the channel region 20 immediately below gate electrode 9 is subjected to p-inversion, so that hole current flows from emitter region 33 through p⁻ impurity region through collector region 36. The hole current which has reached collector region 36 is injected to n diffused region 15, and therefore electron current starts to flow from n impurity diffused region 15 through collector region 36 to n⁻ epitaxial layer 2. Therefore, the device turns "ON" with the hole current and the electrode current flowing simultaneously between emitter electrode 41 and collector electrode 42, whereby the resistance at the "ON" state can be significantly reduced.

Figure 17:
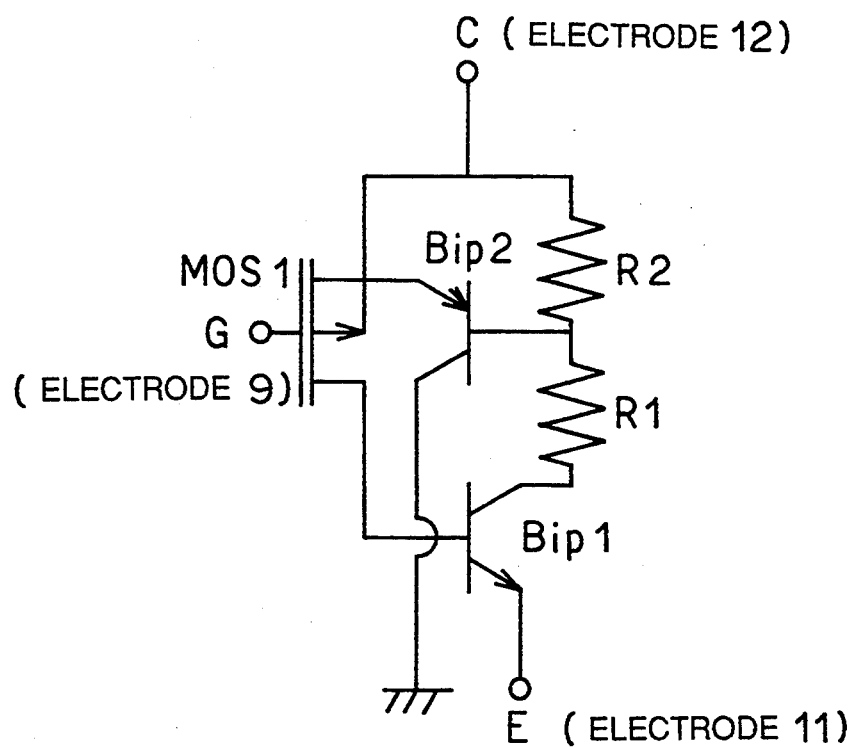
FIG. 17 is an equivalent circuit diagram of the high breakdown voltage type semiconductor device in accordance with the second embodiment of the present invention.

FIG. 17 is an equivalent circuit diagram of the high breakdown voltage type semiconductor device shown in FIG. 13. Referring to FIG. 17, the resistance of n⁻ epitaxial layer 2 from collector region 36 to immediately below emitter region 33 is represented by R1, and the resistance of n⁻ epitaxial layer 2 from immediately below emitter region 33 to n type impurity region 4 is represented by R2. MOS1 represents a p channel MOS transistor including regions 33 and 5 as well as a gate electrode 9, while Bip1 represents an npn transistor including n type impurity diffused region 15 as the emitter region, region 36 as the base region and n⁻ epitaxial layer 2 as the collector region. Bip2 represents a parasitic pnp transistor including emitter region 33, n⁻ epitaxial layer 2 as the base region and p⁻ semiconductor substrate 1 as the collector region. FIG. 15 shows extension of depletion layer when the device is OFF. Since collector region 36 is at the floating state at this time, the breakdown voltage between collector region 36 and n⁻ epitaxial layer 2 is equal to $BV_{CEO}$ of Bip1. Therefore, it is necessary to exert the RESURF effect at such a level that is free from the influence of $BV_{CEO}$.

When MOS1 turns ON, hole current is supplied to the base of Bip1, so that Bip1 turns ON, and as a result, electron current flows to n⁻ epitaxial layer 2. Since hole current of MOS1 and electron current of Bip1 flows simultaneously, the ON resistance can be significantly reduced.

The method of manufacturing the high breakdown voltage type semiconductor device having the above described structure will be described with reference to FIGS. 18 and 19. The steps shown in FIGS. 4 to 10 of the first embodiment are the same as those in the second embodiment, and therefore description thereof is not repeated.

Figure 18:
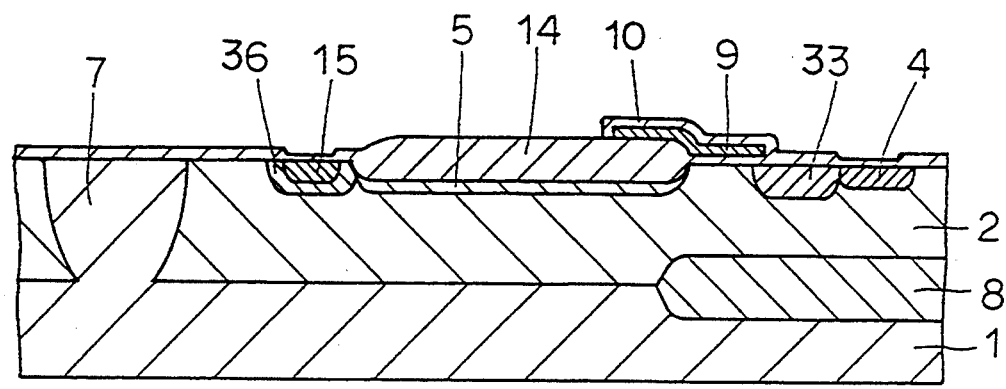
FIGS. 18 and 19 are cross sectional views showing the first and second steps of manufacturing the high breakdown voltage type semiconductor device in accordance with the second embodiment of the present invention.
Figure 19:
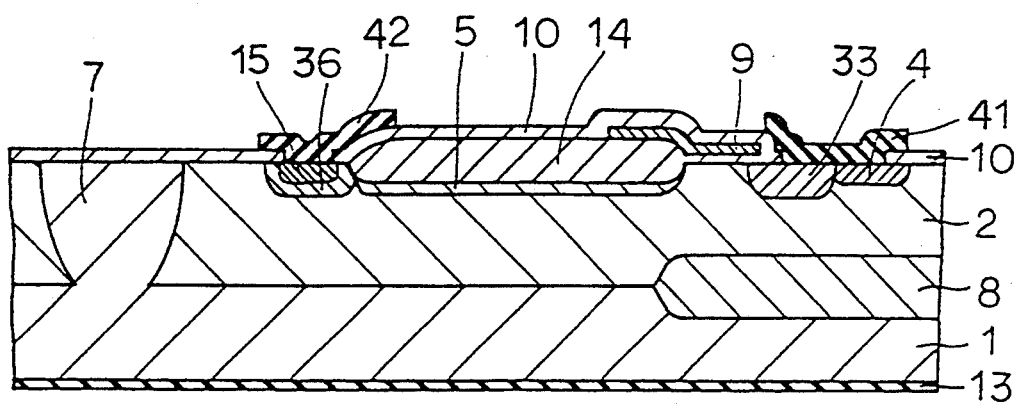

First, referring to FIG. 18, after the formation of oxide film 10, regions of the oxide film 10 which are adjacent to emitter region 33 and collector region 36 are patterned, phosphorus is implanted, and annealing is effected, so that n type impurity region 4 and n type impurity diffused region 15 in collector region 36 are formed simultaneously.

Referring to FIG. 19, oxide film 10 is again deposited on the entire surface of n− epitaxial layer 2. Thereafter, contact holes reaching emitter region 33 and collector region 36 are provided in oxide film 10, Al—Si is deposited by sputtering, patterning is effected by etching, and thus emitter electrode 41 and collector electrode 42 are formed. Thereafter, metal deposition is effected on the rear surface of p− semiconductor substrate to form substrate electrode 13. Through these steps, the high breakdown voltage type semiconductor device shown in FIG. 13 is completed.

As described above, by this embodiment, n type impurity diffused region is formed in the collector region, and the collector electrode is connected to the n type impurity diffused region. Consequently, the hole current which has reached the collector region is introduced to the n type impurity diffused region. As a result, electron current starts to flow from the n type impurity diffused region through collector region to n− epitaxial layer 2. Accordingly, the high breakdown voltage type semiconductor device turns "ON" with the hole current and the electron current flowing simultaneously between emitter electrode and collector electrode, and thus the resistance at "ON" state can be significantly reduced.

Figure 20:
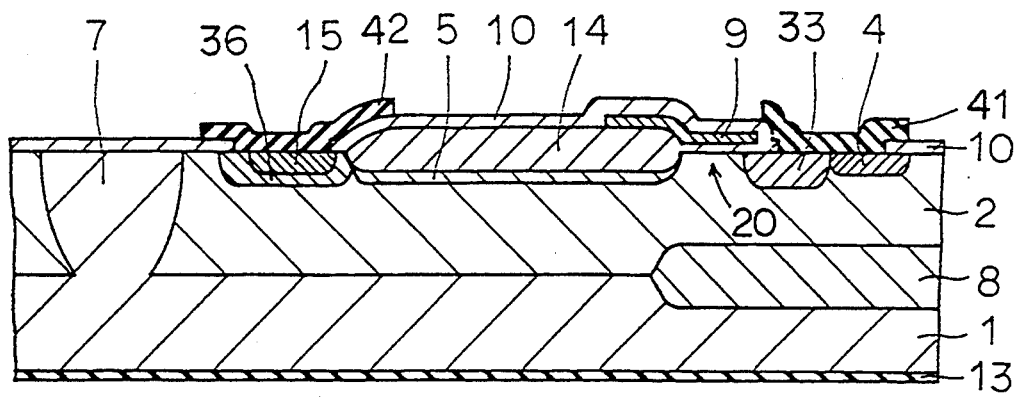
FIG. 20 is a cross sectional view showing a structure of a high breakdown voltage type semiconductor device in accordance with a third embodiment of the present invention.

A third embodiment in accordance with the present invention will be described. FIG. 20 is a cross section showing the structure of the high breakdown voltage type semiconductor device in accordance with the third embodiment. Referring to FIG. 20, an n− epitaxial layer 2 is formed on a p− semiconductor substrate 1. At a prescribed region on the surface of n− epitaxial layer 2, a field oxide film 14 is formed. A p− impurity region 5 is formed to be in contact with the lower surface of field oxide film 14. On one side of field oxide film 14, a p type emitter region 33 is provided with a prescribed distance so as to provide a channel region 20. On the side of emitter region 33 opposing to channel region 20, an n type impurity region 4 is formed in contact with emitter region 33.

Above channel region 20, a gate electrode 9 is formed with a gate oxide film 21 interposed therebetween. On emitter region 33, n type impurity region 4, n− epitaxial layer 2 and gate electrode 9, an emitter electrode 41 is provided. Between n− epitaxial layer 2 and emitter electrode 41 and between gate electrode 9 and emitter electrode 41, oxide film 10 is interposed.

Meanwhile, on the other side of field oxide film 14, a p type collector region 36 is formed to be in contact with p− impurity region 5. In p type collector region 36, an n type impurity region 15 is formed. On p type collector region 36, n type impurity region 15 and n− epitaxial layer 2, a collector electrode 42 is provided. Between n− epitaxial layer and collector electrode 42, oxide film 10 is interposed.

Figure 21:
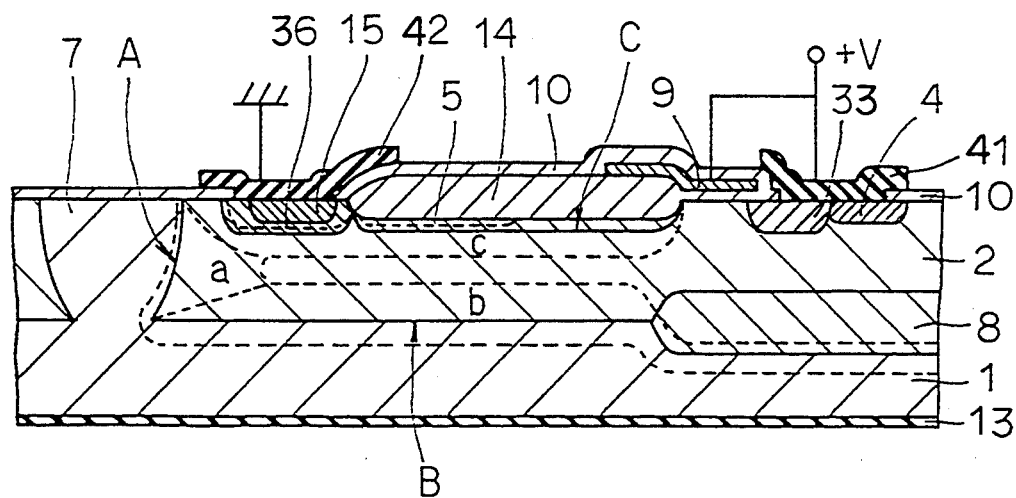
FIG. 21 is a first schematic illustration showing the principle of operation of the high breakdown voltage type semiconductor device in accordance with the third embodiment of the present invention.

The principle of operation of the high breakdown voltage type semiconductor device having the above described structure will be described with reference to FIGS. 21 to 23. First, referring to FIG. 21, collector electrode 42 and substrate electrode 13 are set to 0V. Gate electrode 9 and emitter electrode 41 are short circuited, and a voltage of +V is applied thereto.

At this time, the depletion layer generated in the semiconductor device extends from junction B between n− epitaxial layer 2 and p° semiconductor substrate 1, junction A between n− epitaxial layer 2 and p type isolation region 7, and from junction C between n− epitaxial layer 2 and p− impurity region 5.

The depletion layer a extending from junction A tends to extend more by the influence of depletion layer b extending from junction B, because of the RESURF effects as in the second embodiment, and therefore the electric field at junction A is kept at a relatively small value.

Meanwhile, the depletion layer c extending from junction C extends toward n− epitaxial layer 2 and, at the same time, depletes p− impurity region 5 since p− impurity region 5 has low concentration. Further, since p− impurity region 5 is formed simultaneously with oxidation of field oxide film 14, the surface concentration of p− impurity region 5 has been made lower because of segregation. Therefore, even if the resistance value p− impurity region 5 is the same as the prior art, it is more likely be depleted.

The gate electrode 9 formed overlapped on field oxide film 14 constitutes a field plate. The distance to p− impurity region 5 from gate electrode 9 increases gradually. Therefore, it promotes depletion of p− impurity region 5, and effectively relaxes electric field concentration of junction C near gate electrode 9.

Figure 22:
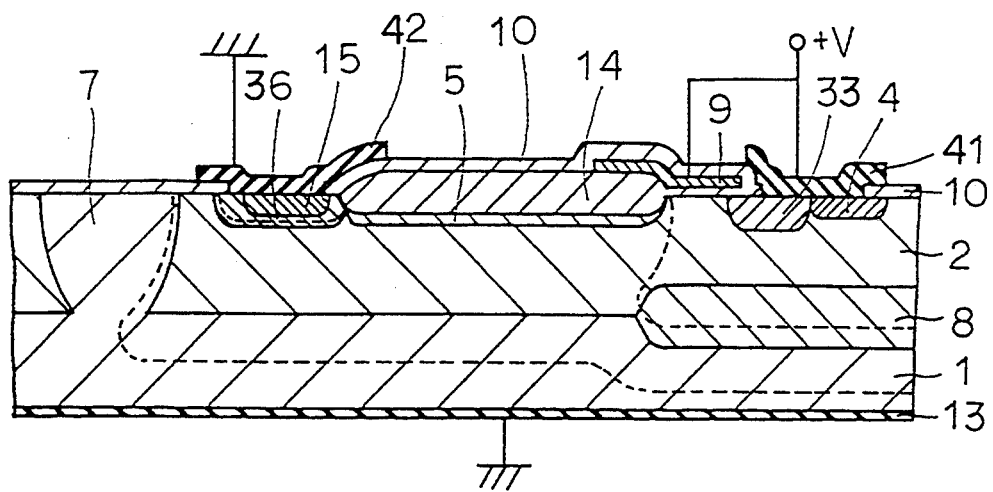
FIG. 22 is a second schematic illustration showing the principle of operation of the high breakdown voltage type semiconductor device in accordance with the third embodiment of the present invention.
Figure 23:
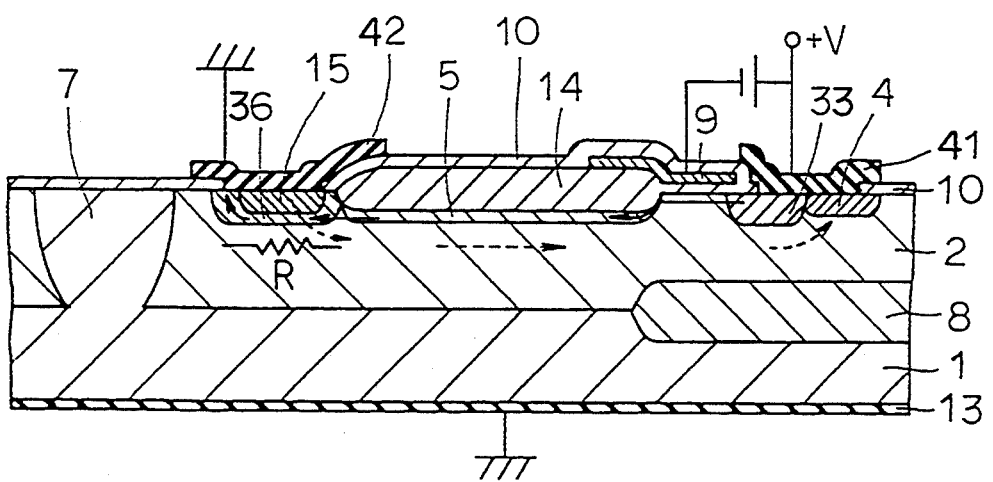
FIG. 23 is a third schematic illustration showing the principle of operation of the high breakdown voltage type semiconductor device in accordance with the third embodiment of the present invention.

Now, if the voltage +V is further increased, referring to FIG. 22, finally the breakdown voltage is determined by the junction between n+ buried layer 8 and p− semiconductor substrate 1. At this time, n− epitaxial layer 2 and p− impurity region 5 are almost depleted. In this state, the semiconductor device can be kept "OFF".

Then, referring to FIG. 22, if the potential at gate electrode 9 is made lower with respect to emitter electrode 41, the channel region 20 immediately below gate electrode 9 is subjected to p-inversion, so that hole current flows from emitter region 33 through p− impurity region 5 to collector region 36. The hole current which has reached collector region 36 flows in collector electrode 42 through a pinch resistance portion R formed below n type impurity diffused region 15.

Therefore, if the hole current exceeds a certain value, a forward bias is generated between collector region 36 and n type impurity diffused region 15 because of a voltage drop generated at the pinch resistance R, so that electron current flows from n type impurity diffused region through collector region 36 to n− epitaxial layer 2. Since the device turns "ON" with the hole current and electron current flowing simultaneously between emitter electrode 41 and collector electrode 42, the resistance at the "ON" state can be significantly reduced.

Figure 24:
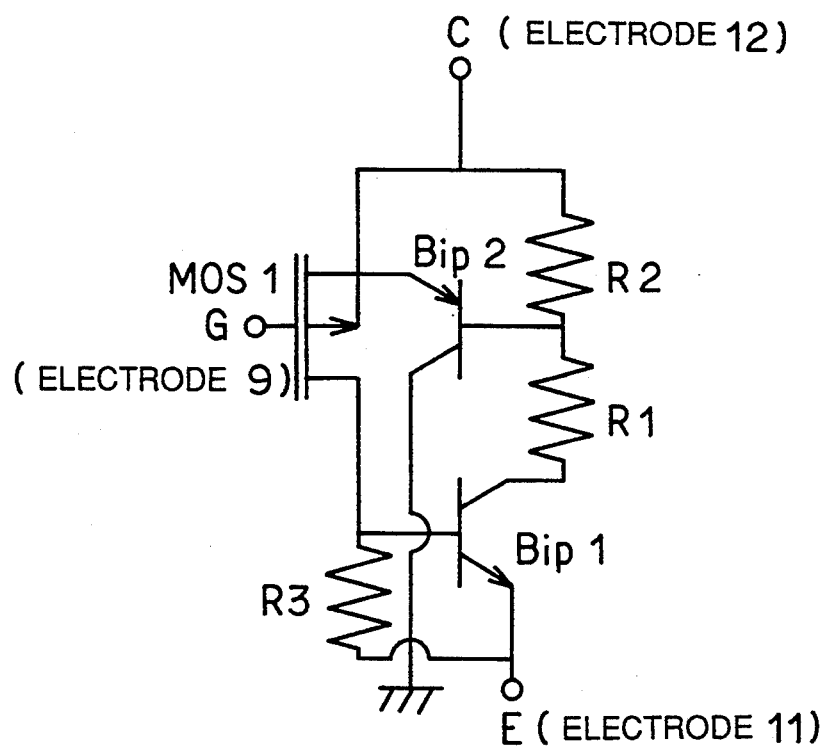
FIG. 24 is an equivalent circuit diagram of the high breakdown voltage type semiconductor device in accordance with the third embodiment of the present invention.

FIG. 24 is an equivalent circuit diagram of the high breakdown voltage type semiconductor device shown in FIG. 20. Referring to FIG. 24, the resistance of n− epitaxial layer 2 from collector region 36 to immediately below emitter region 33 is represented by R1, the resistance of n− epitaxial layer 2 from immediately below emitter region 33 to n type impurity region 4 is representative by R2 and pinch resistance at collector region 36 is represented by R3. MOS1 represents a p channel MOS transistor including region 33 as the source region, region 5 as the drain, and the gate electrode 9. Bip1 represents an npn transistor including n type impurity diffused region 15 as the emitter region, base region 36 and the n− epitaxial layer 2 as the collector region. Bip2 represents a parasitic pnp transistor including emitter region 33, n⁻ epitaxial layer 2 as the base region, and p⁻ semiconductor substrate 1 as the collector region.

FIG. 22 shows the extension of depletion layer when the device is OFF. At this time, since collector region 36 is in contact with collector electrode 42, the breakdown voltage between collector region 36 and n⁻ epitaxial layer 2 is approximately equal to $BV_{CEO}$. Therefore, as compared with the voltage $BV_{CEO}$ in the second embodiment described above, the breakdown voltage at this portion can be made higher, enlarging the margin of the RESURF effect.

When MOS1 turns ON, hole current is supplied to the collector region 36 of Bip1. If the hole current increases, Bip1 turns ON because of the voltage drop generated at pinch resistance R3, causing electron current flowing through n⁻ epitaxial layer 2. Since the hole current MOS1 and electron current of Bip1 flow simultaneously, the ON resistance can be significantly reduced.

The method of manufacturing the high breakdown voltage type semiconductor device having the above structure will be described with reference to FIGS. 25 and 26. As in the second embodiment, the steps from FIGS. 4 to 10 are the same as those in the first embodiment, and therefore description thereof is not repeated.

Figure 25:
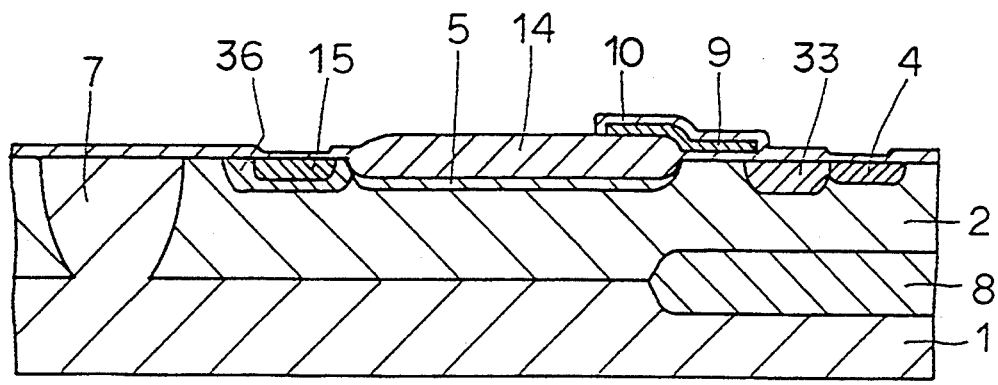
FIGS. 25 and 26 are cross sectional views showing first and second steps of manufacturing the high breakdown voltage type semiconductor device in accordance with the third embodiment of the present invention.
Figure 26:
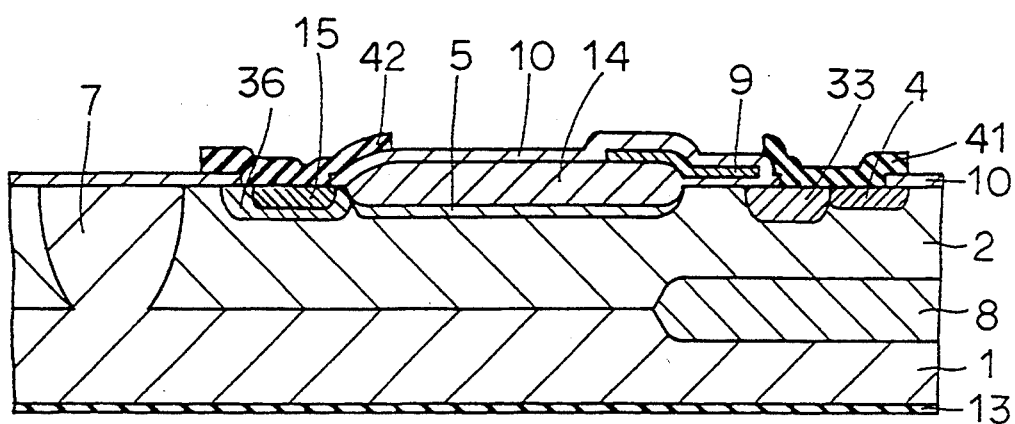

Referring to FIG. 25, those regions of oxide film 10 which is near emitter region 33 and above collector region 36 are patterned, phosphorus is introduced, annealing is effected, and thus n type impurity region 4 and n type impurity diffused region 15 are formed simultaneously.

Then, referring to FIG. 26, oxide film 10 is again deposited on the entire surface of n⁻ epitaxial layer 2. Thereafter, contact holes reaching emitter region 33 and n type impurity region 4 and reaching collector region 36 and n type impurity diffused region 15 are provided in oxide film 10, Al—Si is deposited by sputtering, patterning is effected by etching, and thus emitter electrode 41 and collector electrode 42 are formed. Thereafter, metal deposition is effected on the rear surface of p⁻ semiconductor substrate 1 to form substrate electrode 13. Through these steps, the high breakdown voltage type semiconductor device shown in FIG. 20 is completed.

As described above, by the high breakdown voltage type semiconductor device and manufacturing method thereof in accordance with this embodiment, the n type impurity diffused region is formed in the collector region, and further, the collector electrode is connected to the collector region and the n type impurity diffused region.

Therefore, hole current flows to the collector region. The hole current which has reached the collector region flows into the collector electrode through the pinch resistance portion formed below the n type impurity diffused region. Therefore, when the hole current exceeds a prescribed value, a forward bias is applied between collector region and n type impurity diffused region, because of the voltage drop generated at the pinch resistance.

As a result, electron current flows from the n type impurity diffused region through the collector region to the n⁻ epitaxial layer 2. Since the device turns "ON" with the whole electron and the electron flowing simultaneously between the collector electrode and the emitter electrode, the resistance at the "ON" state can be significantly reduced.

Figure 27:
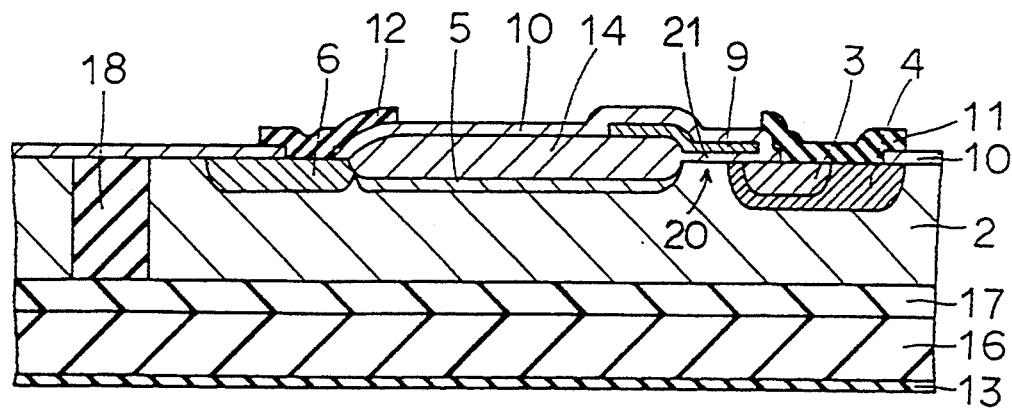
FIG. 27 is a cross section showing a structure of a high breakdown voltage type semiconductor device in accordance with a fourth embodiment of the present invention.

The fourth embodiment in accordance with the present invention will be described. FIG. 27 is a cross section showing the structure of the high breakdown voltage type semiconductor device in accordance with the fourth embodiment. Referring to FIG. 27, a silicon oxide film 17 is formed on the p⁻ semiconductor substrate 16. On silicon oxide film 17, an n⁻ epitaxial layer 2 is formed.

At a prescribed region on the surface of n⁻ epitaxial layer 2, a field oxide film 14 is formed. A p⁻ impurity region 5 is formed to be in contact with the lower surface of field oxide film 14. On one side of field oxide film 14, an n type impurity region 4 is formed with a prescribed distance so as to provide a channel region 20. Above channel region 20, a gate electrode 9 is interposed with a gate oxide film 21 interposed therebetween. On source region 3, n type impurity region 4, n⁻ epitaxial layer 2 and gate electrode 9, a source electrode 11 is formed. Between n⁻ epitaxial layer 2 and source electrode 11, and between gate electrode 9 and source electrode 11, oxide film 10 is interposed.

Meanwhile, on the other side of field oxide film 14, a p type drain region 6 is formed to be in contact with p⁻ impurity region 5. On p type drain region 6 and n⁻ epitaxial layer 2, a drain electrode 12 is provided. Between n⁻ epitaxial layer 22 and drain electrode 12, oxide film 10 is interposed.

Figure 28:
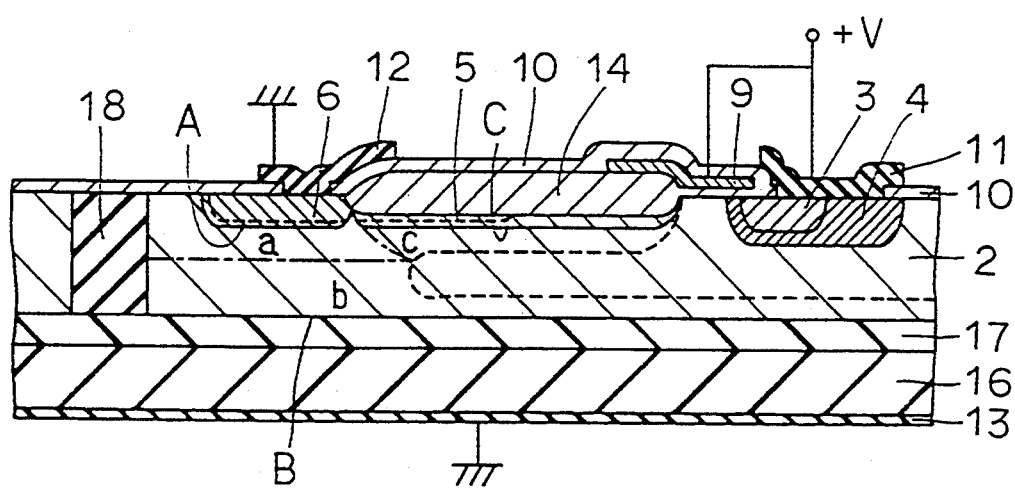
FIG. 28 is a first schematic illustration showing the principle of operation of the high breakdown voltage type semiconductor device in accordance with the fourth embodiment of the present invention.

The principle of operation of the high breakdown voltage type semiconductor device having the above structure will be described with reference to FIGS. 28 to 30. First, referring to FIG. 28, the drain electrode 12 and the substrate electrode 13 are set to 0 V. Gate electrode 9 and source electrode 11 are short-circuited, and a voltage of +V is applied thereto.

At this time, the depletion layer generated in semiconductor device extends from junction A between n⁻ epitaxial layer 2 and drain region 6, and from junction C between n⁻ epitaxial layer 2 and p type isolation region 5. At this time, since the potential at p type semiconductor substrate 16 is equal to that of drain region 6, it exerts the field plate effect on the depletion layer a extending from junction A. Therefore, depletion layer b extends from junction B between oxide film 17 and n⁻ epitaxial layer 2.

Since depletion layer a extending from junction a is likely to extend more because of the influence of depletion layer b from junction B, the electric field at junction B is kept at a relatively small value. This effect is generally referred to as RESURF effect. The depletion layer c extending from junction C extends toward n⁻ epitaxial layer 2 and, at the same time, depletes p⁻ impurity region 5, since p⁻ impurity diffused region 5 has low concentration.

Since p⁻ impurity region 5 is formed simultaneously with oxidation of field oxide film 14, the surface concentration of p⁻ impurity region 5 has been made lower because of the influence of segregation. Therefore, even if the resistance of p⁻ impurity region 5 is the same as in the prior art, it is more likely be depleted in the present embodiment.

The electrode 9 formed overlapping field oxide 14 provides a field plate. Since the distance from the field plate to p⁻ impurity diffused region 5 increases gradually, it promotes depletion of p⁻ impurity diffused region 5, and effectively relaxes the electric field of junction C near gate electrode 9.

Figure 29:
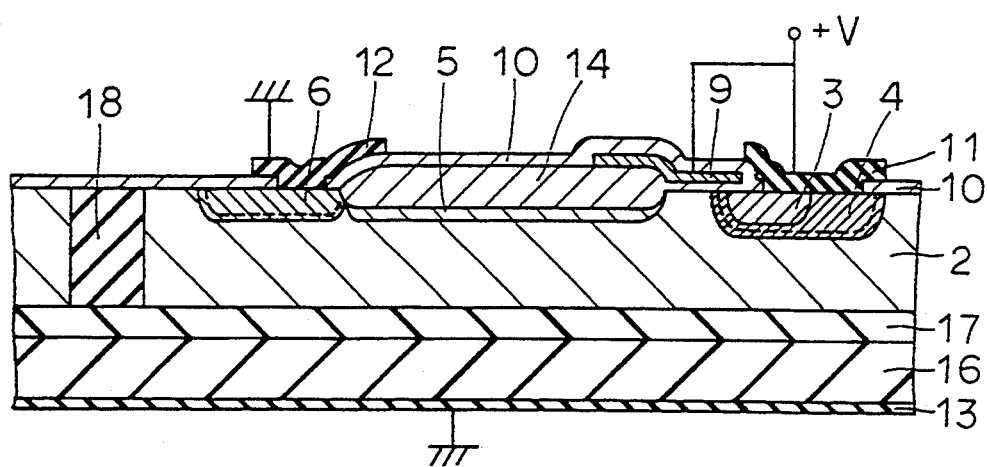
FIG. 29 is a second schematic illustration showing the principle of operation of the high breakdown voltage type semiconductor device in accordance with the fourth embodiment of the present invention.

Then, referring to FIG. 29, if the voltage +V is increased, finally, the breakdown voltage is determined by the junction between oxide film 17 and p− semiconductor substrate 16. At this time, n− epitaxial layer 2 and p− impurity region 5 are almost depleted. In this state, the device can be kept "OFF".

Figure 30:
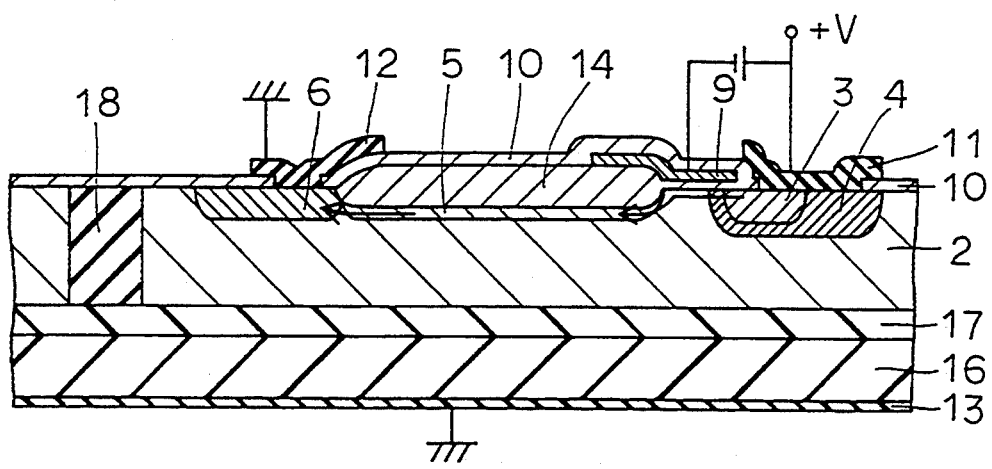
FIG. 30 is a third schematic illustration showing the principle of operation of the high breakdown voltage type semiconductor device in accordance with the fourth embodiment of the present invention.
Figure 31:
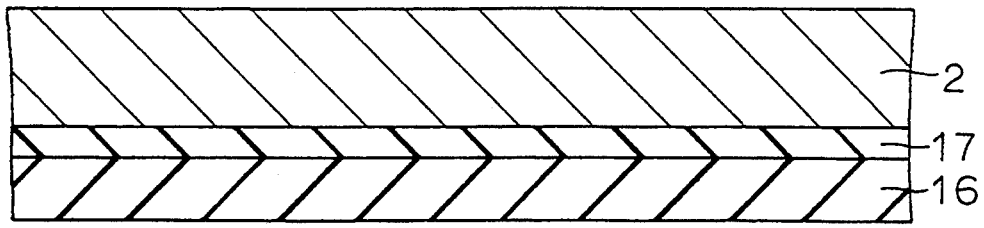
FIGS. 31 to 41 are cross sectional views showing the first to eleventh steps of manufacturing the high breakdown voltage type semiconductor device in accordance with the fourth embodiment of the present invention.

Referring to FIG. 30, if the potential of gate electrode 9 is made lower with respect to the source electrode 11, channel region 20 immediately below gate electrode 9 is subjected to p-inversion, and hole current flows from source region 3 through p− diffused region 5 to drain region 6, thus turning the device "ON".

The method of manufacturing the high breakdown voltage type semiconductor device having the above structure will be described with reference to FIGS. 31 to 41. First, referring to FIG. 31, an oxide film 17 is formed on a p− semiconductor substrate 16. On oxide film 17, an n− epitaxial layer 2 is formed by epitaxial growth.

Figure 32:
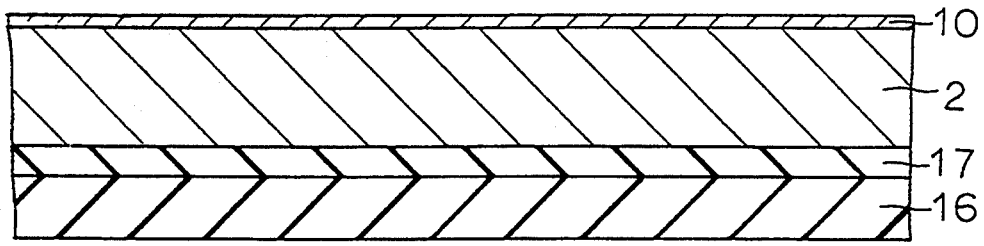
Figure 33:
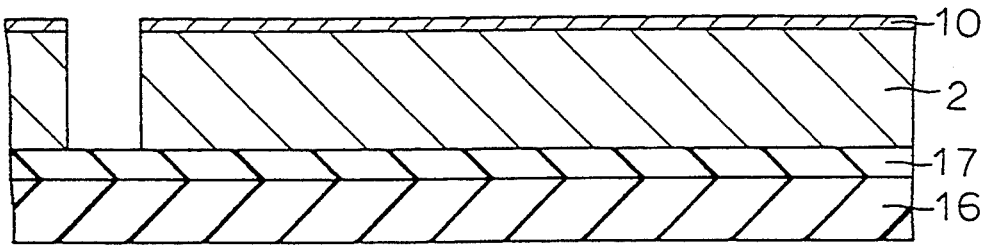

Referring to FIG. 32, an oxide film 10 having a prescribed pattern is formed on n− epitaxial layer 2. Then, referring to FIG. 33, n− epitaxial layer 2 is etched, using oxide film 10 as a mask.

Figure 34:
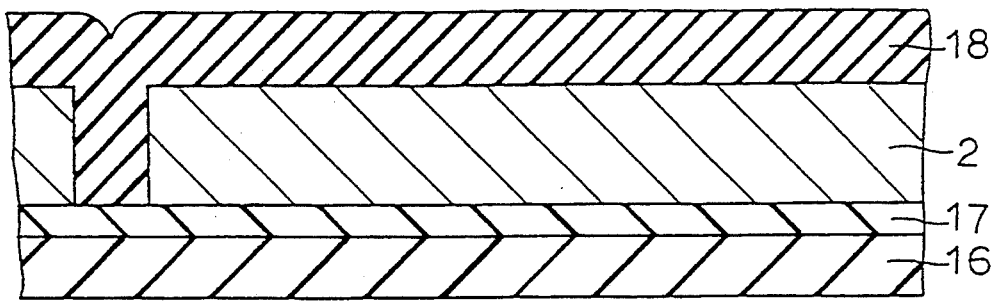
Figure 35:
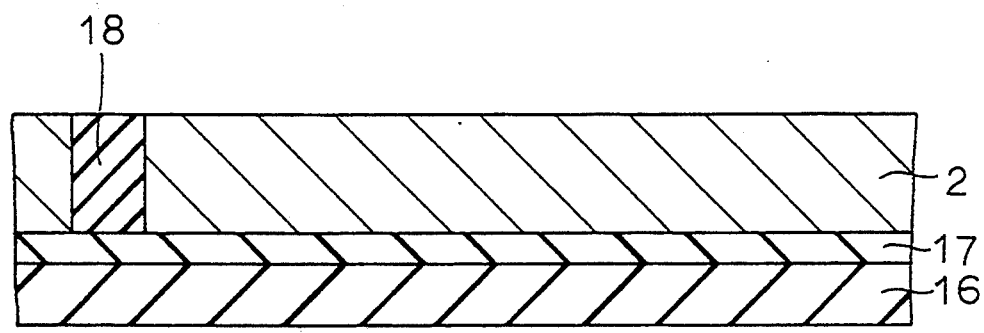

Referring to FIG. 34, after removal of oxide film 10, a silicon oxide film 18 is deposited on the entire surface of n− epitaxial layer 2 by, for example, CVD method. Then, referring to FIG. 35, silicon oxide film 18 is etched back so as to form buried oxide film 18.

Figure 36:
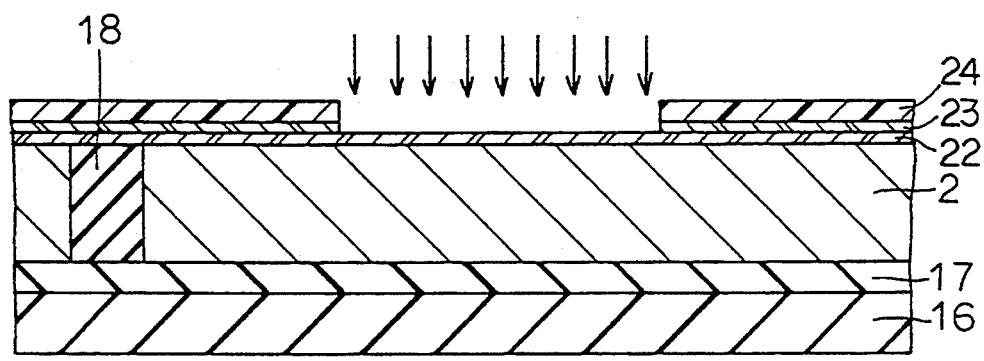

Referring to FIG. 36, an oxide film 22 is again formed on n− epitaxial layer 2, and on oxide film 22, a nitride film 23 is formed. Thereafter, a resist film 24 having a prescribed pattern is formed on nitride film 23, and nitride film 23 is patterned by using resist film 24 as a mask. Then, using resist film 24 and nitride film 23 as a mask, boron is implanted to n− epitaxial layer 2.

Figure 37:
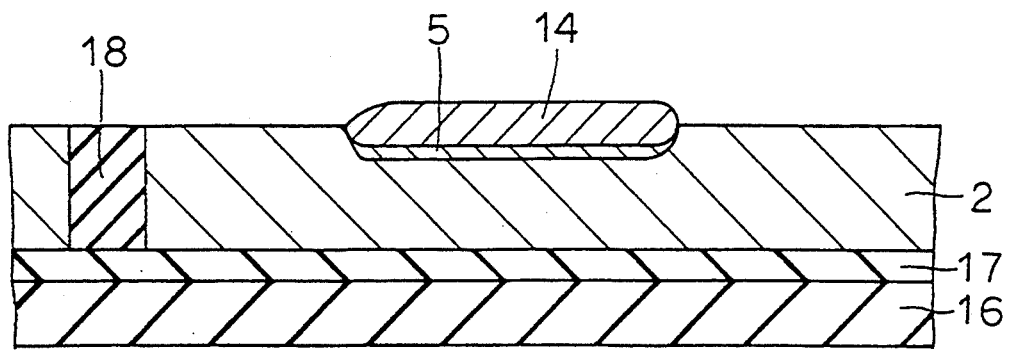

Then, referring to FIG. 37, after resist film 24 is removed, selective oxidation is effected using nitride film 23 as a mask, and thus a field oxide film 14 is formed. At this time, at a region below the lower surface of field oxide film 14, p− impurity region 5 is formed. Thereafter, nitride film 23 and oxide film 22 are removed.

Figure 38:
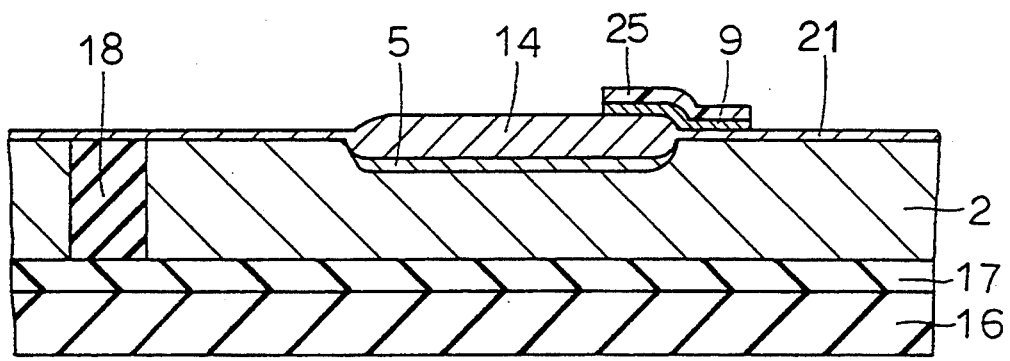

Then, referring to FIG. 38, on the surface of n− epitaxial layer 2, oxide film 21 and polysilicon film 9 are formed. Thereafter, a resist film 25 having a prescribed shaped is formed on polysilicon 9, and using resist film 25 as a mask, polysilicon film 9 is patterned to form a gate electrode 9.

Figure 39:
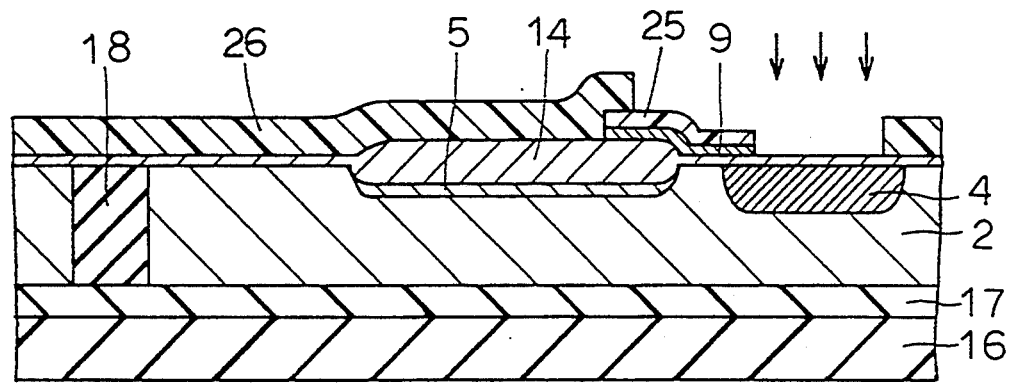
Figure 40:
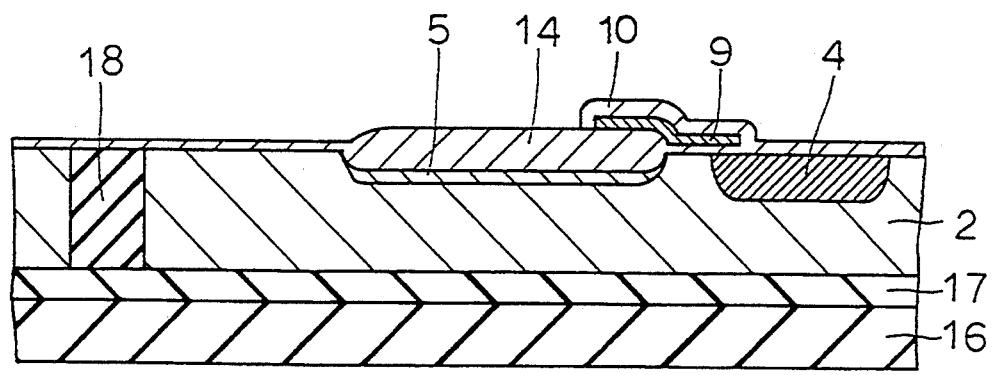

Then, referring to FIG. 39, a resist film 26 having a prescribed pattern is formed on n− epitaxial layer 2, phosphorus is introduced to n− epitaxial layer 2 using resist film 26 and resist film 25 as a mask, annealing is effected, and thus n type impurity region 4 is formed. Then, referring to FIG. 40, after the removal of resist films 25 and 26, an oxide film 10 is formed to cover gate electrode 9.

Figure 41:
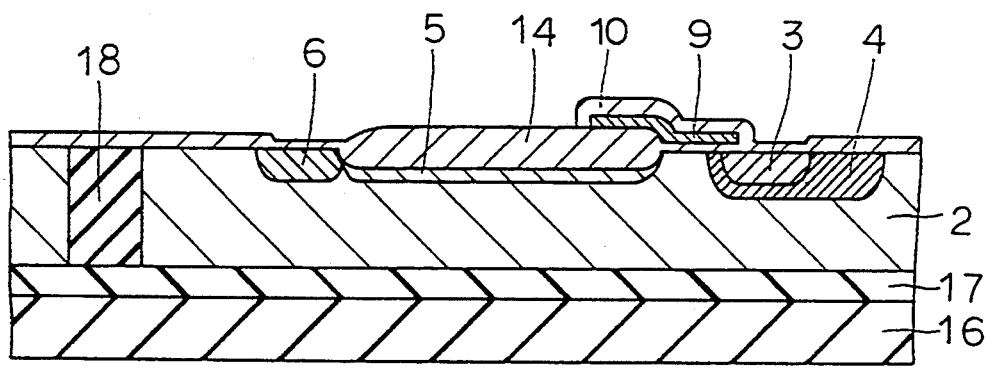

Referring to FIG. 41, that region of the oxide film 10 which is adjacent to gate electrode 9, and the region on the side of field insulating film 14 opposing to oxide film 9 are patterned, boron is implanted, and annealing is effected, so that source region 3 and drain region 6 are formed simultaneously. Thereafter, an oxide film is deposited on the entire surface of n− epitaxial layer 2.

In oxide film 10, contact holes reaching source region 3 and drain region 6 are provided, Al—Si is deposited by sputtering, and then patterning is effected by etching, so that source electrode 11 and drain electrode 12 are formed. Thereafter, metal deposition is effected on the rear surface of p− semiconductor substrate 16 to form substrate electrode 13. Thus, the high breakdown voltage type semiconductor device shown in FIG. 27 is completed.

As described above, by the high breakdown voltage type semiconductor device in accordance with this embodiment, the n− impurity diffused region is formed to cover the source region. This promotes depletion of n− epitaxial layer. Therefore, a high breakdown voltage type semiconductor device which provides high breakdown voltage when it is "OFF" can be provided.

Figure 42:
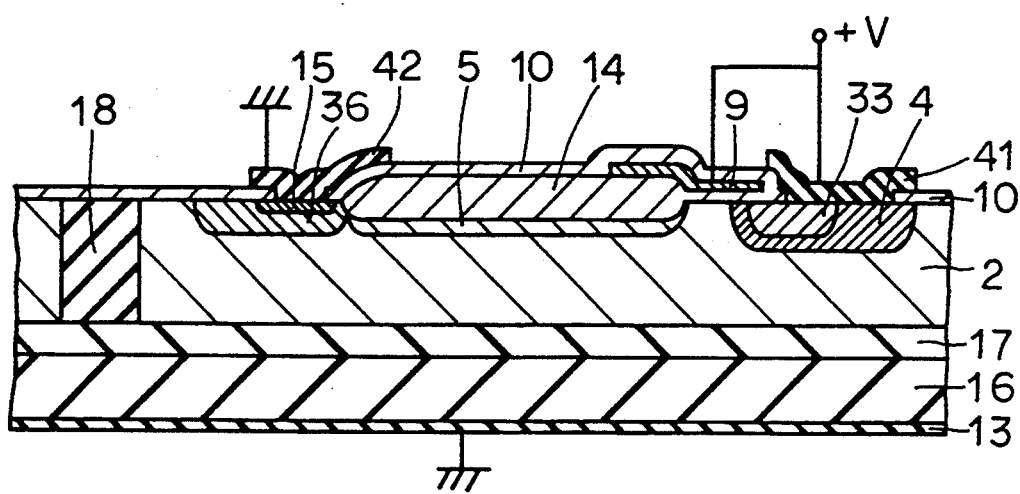
FIG. 42 is a first cross section showing a structure of a high breakdown voltage type semiconductor device in accordance with a fifth embodiment of the present invention.

A fifth embodiment in accordance with the present invention will be described. FIG. 42 is a cross section showing the structure of the high breakdown voltage type semiconductor device in accordance with the fifth embodiment. The structure of the high breakdown voltage type semiconductor device of the fifth embodiment is obtained by providing the structure of the second embodiment on an SOI substrate.

Figure 43:
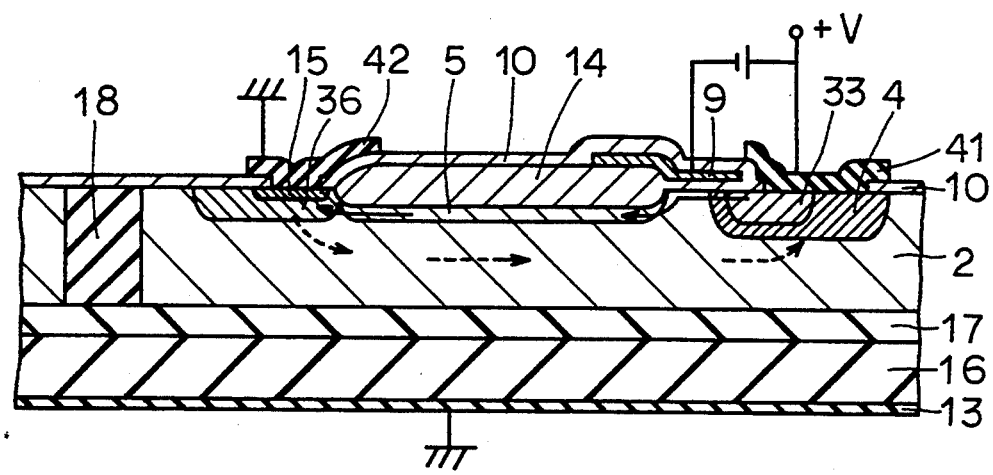
FIG. 43 is a second cross section showing a structure of the high breakdown voltage type semiconductor device in accordance with the fifth embodiment of the present invention.
Figure 44:
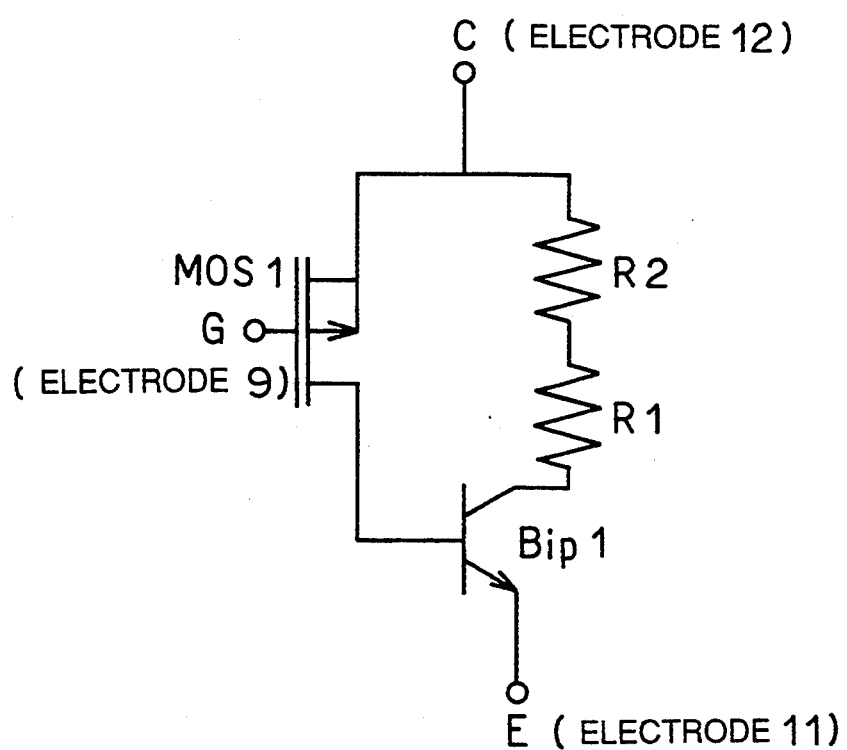
FIG. 44 is an equivalent circuit diagram of the high breakdown voltage type semiconductor device in accordance with the fifth embodiment of the present invention.
Figure 45:
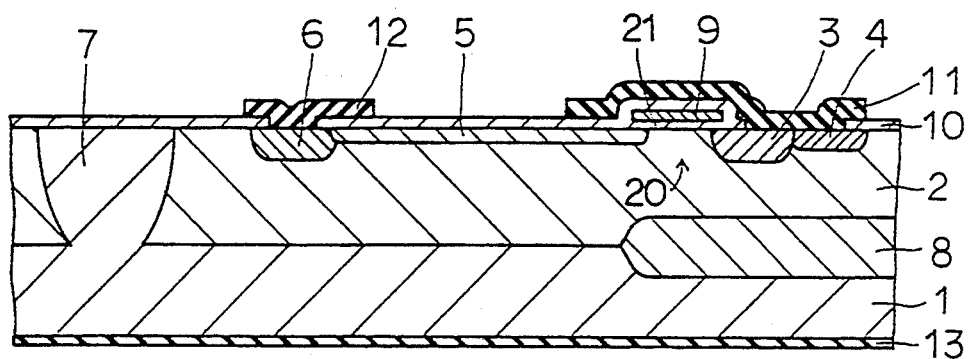
FIG. 45 is a cross section showing a structure of a first conventional high breakdown voltage type semiconductor device.
Figure 46:
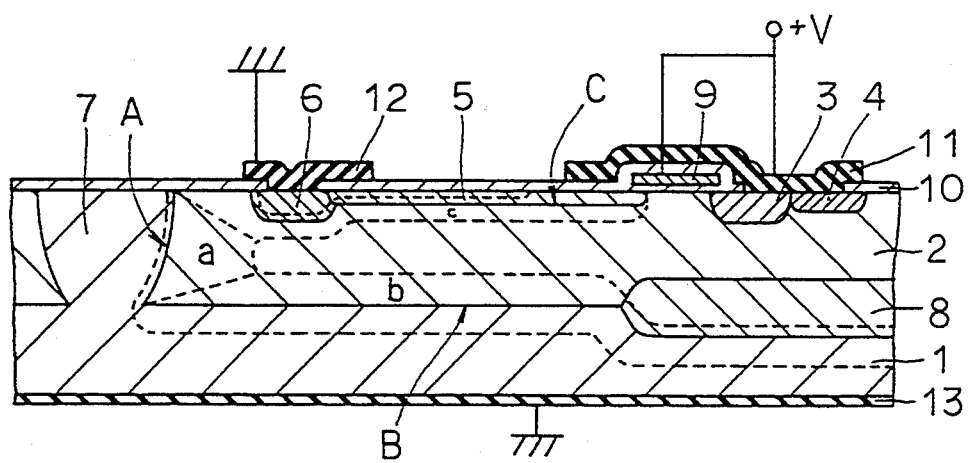
FIGS. 46 to 48 are first to third schematic illustrations showing the principle of operation of the first conventional high breakdown voltage type semiconductor device.
Figure 47:
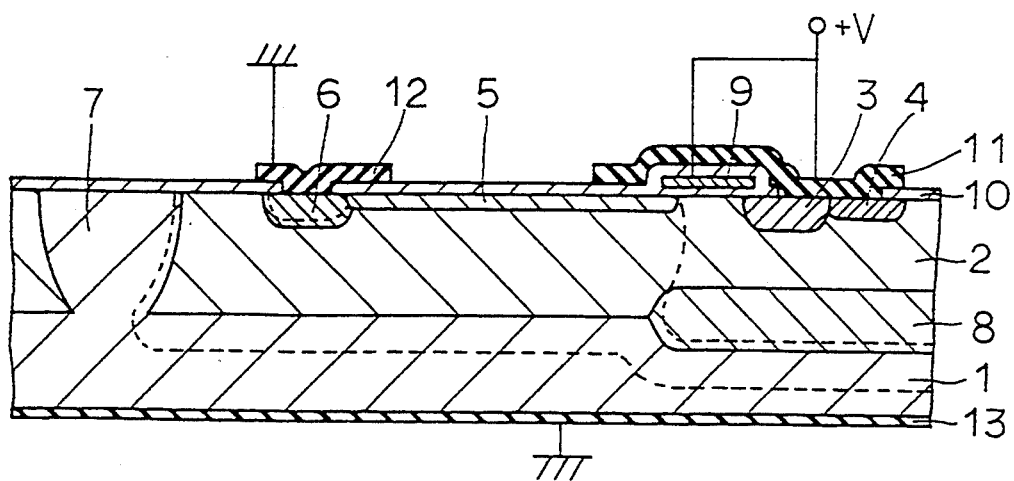
Figure 48:
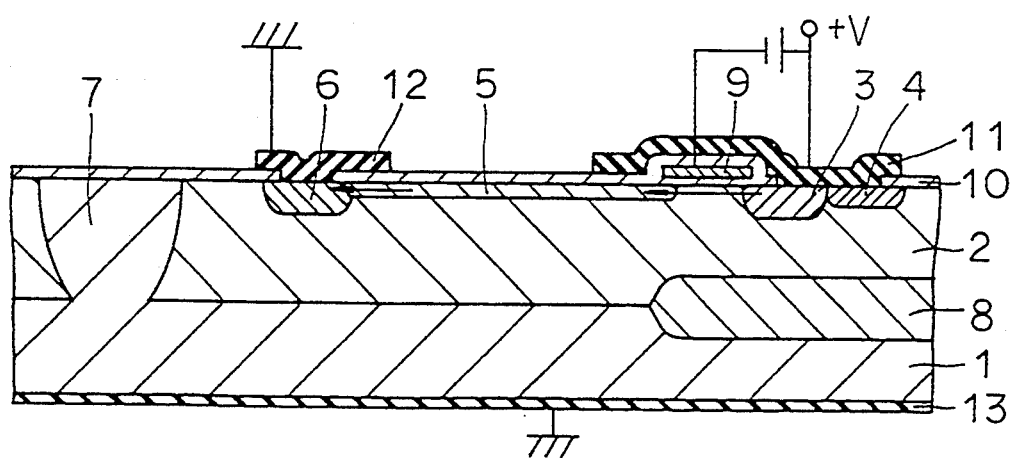
Figure 49:
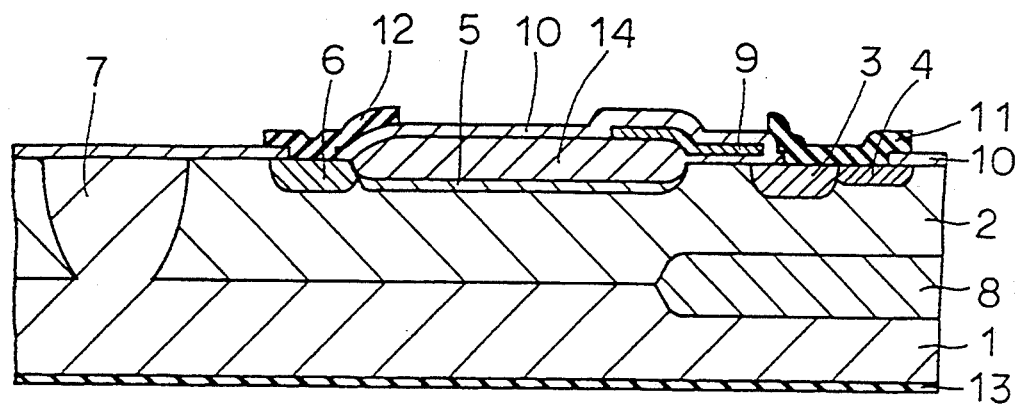
FIG. 49 is a cross section showing a structure of a second conventional high breakdown voltage type semiconductor device.
Figure 50:
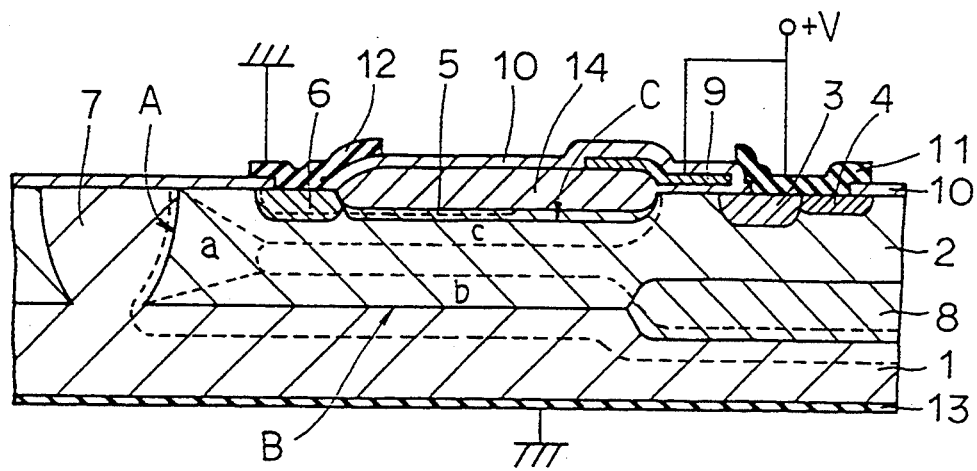
FIGS. 50 to 52 are first to third schematic illustrations showing the principle of operation of the second conventional high breakdown voltage type semiconductor device.
Figure 51:
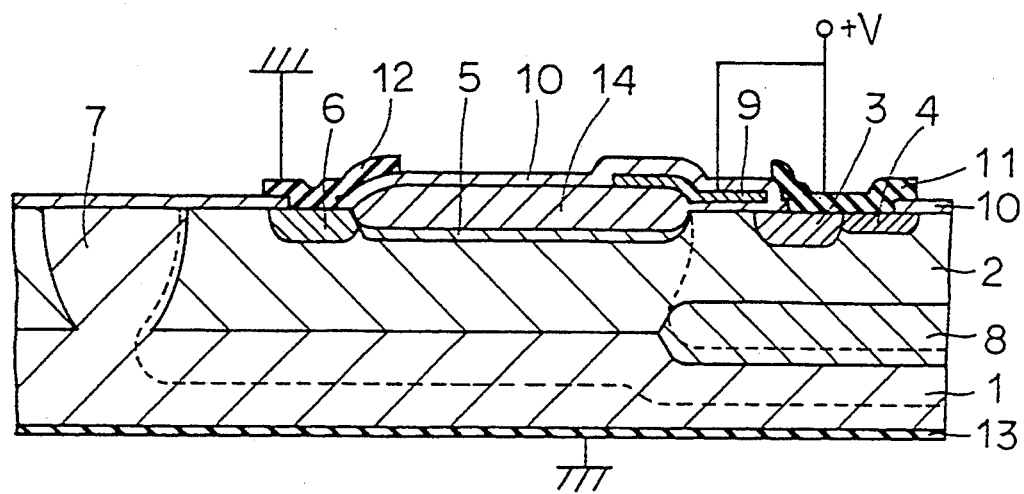
Figure 52:
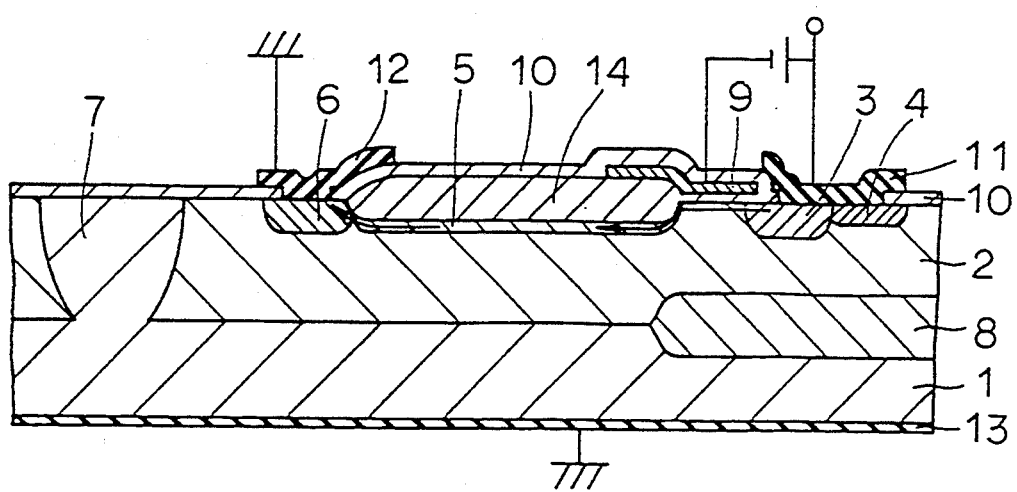
Figure 53:
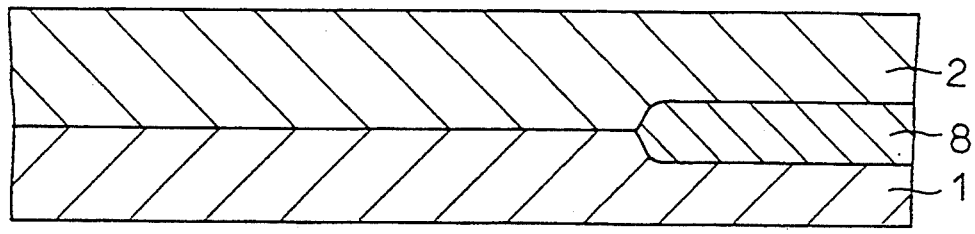
FIGS. 53 to 61 are cross sections showing first to ninth steps of manufacturing the second conventional high breakdown voltage type semiconductor device.
Figure 54:
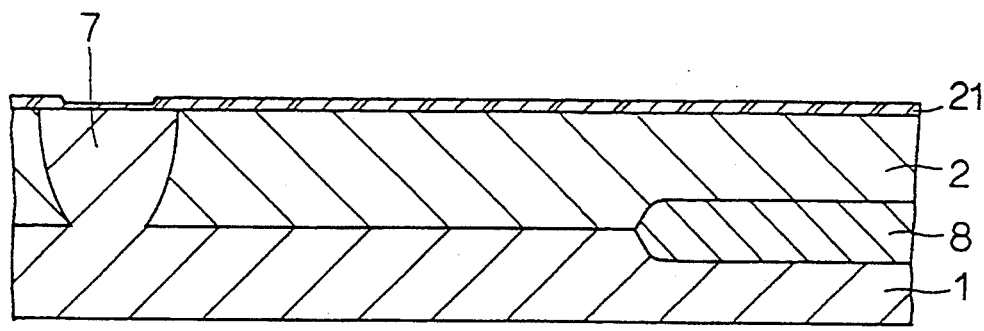
Figure 55:
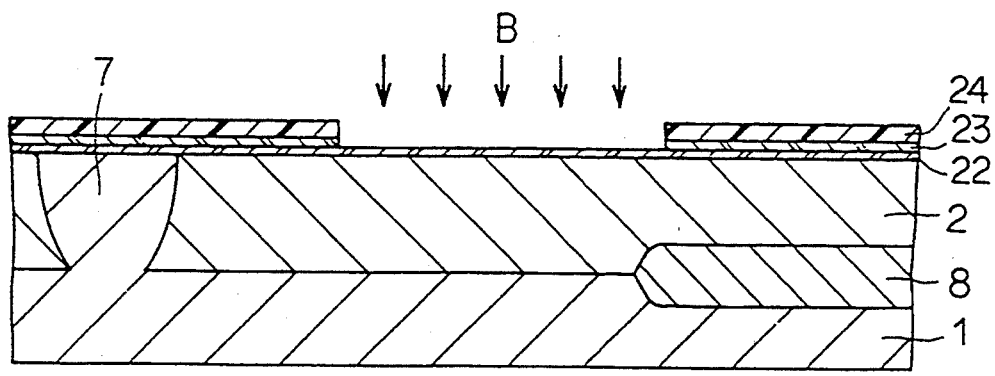
Figure 56:
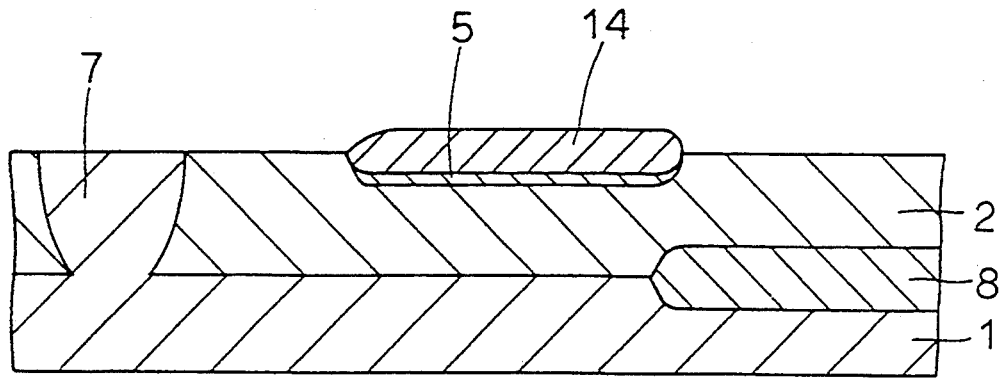
Figure 57:
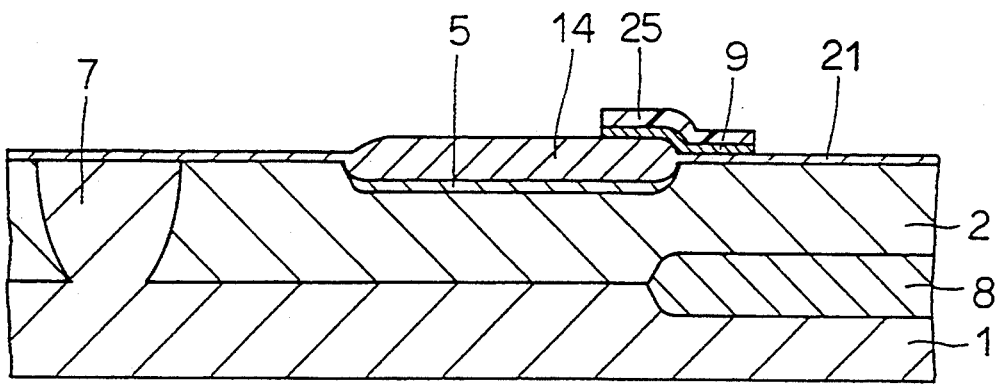
Figure 58:
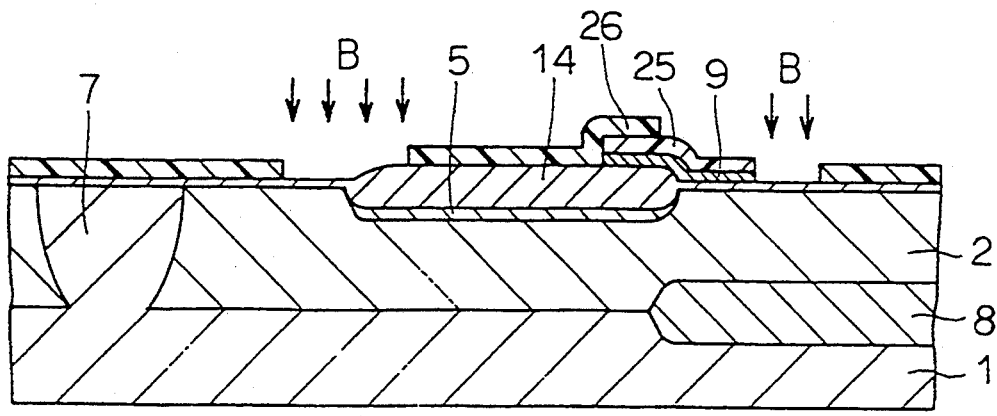
Figure 59:
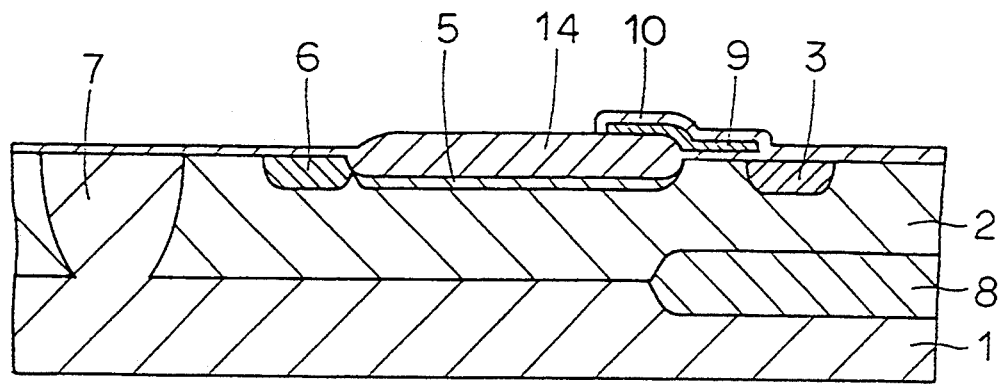
Figure 60:
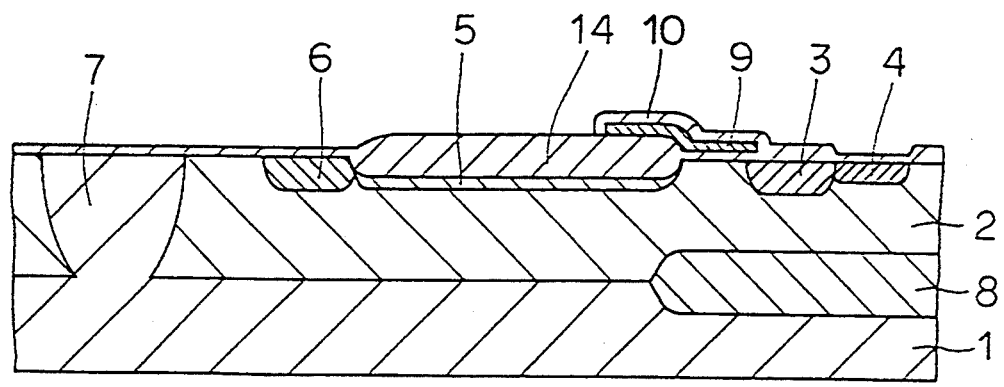
Figure 61:
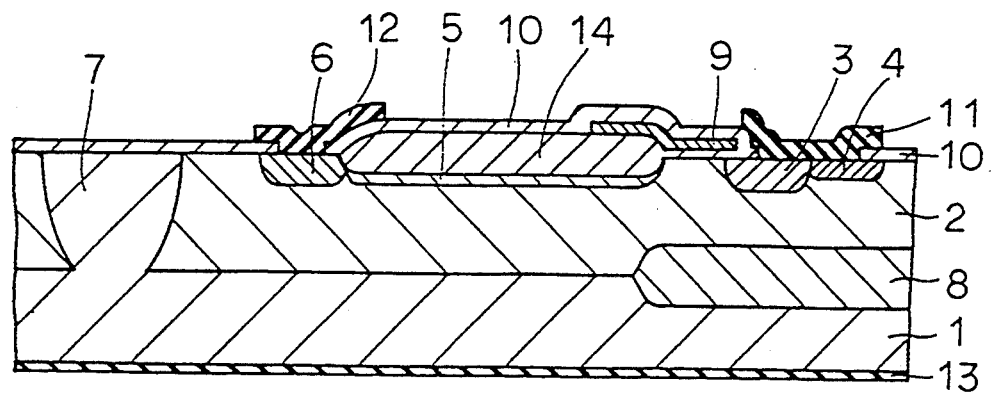
Figure 62:
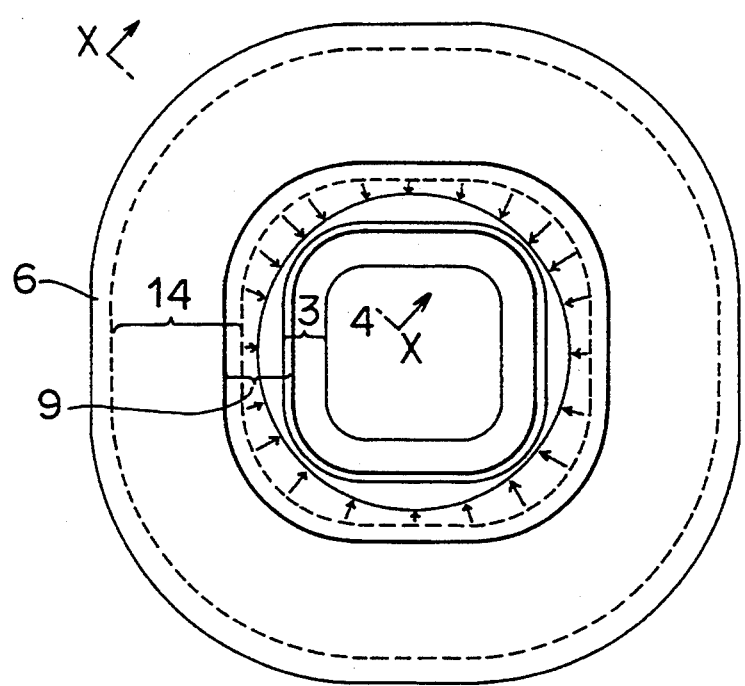
FIG. 62 is a plan view showing disadvantage of the conventional high breakdown voltage type semiconductor device.
Figure 63:
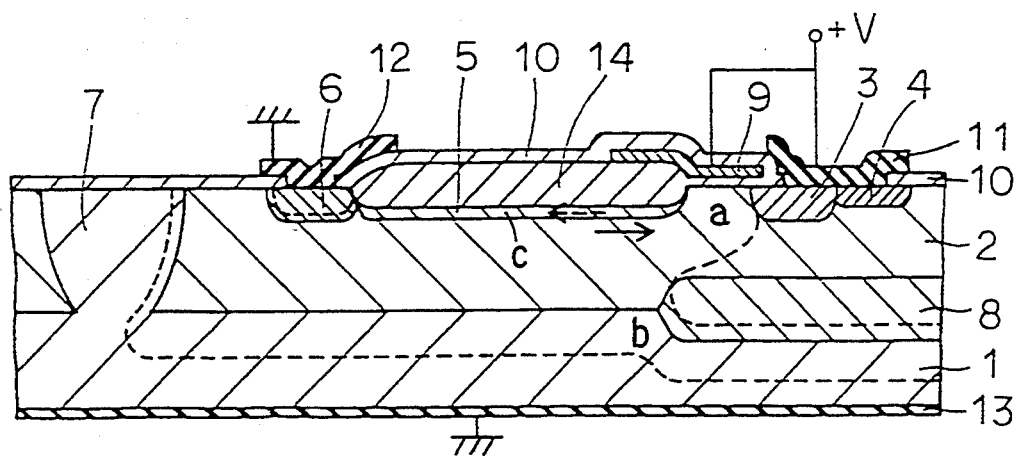
FIG. 63 is a cross section showing disadvantage of the conventional high breakdown voltage type semiconductor device.

FIG. 52 shows the high breakdown voltage type semiconductor device of the fifth embodiment when it is OFF, while FIG. 43 shows the device of the fifth embodiment when it is "ON". FIG. 44 is an equivalent circuit diagram of the high breakdown voltage type semiconductor device of the fifth embodiment. The operation of the device is the same as in the second embodiment when it is both ON and OFF. However, as can be seen from the equivalent circuit diagram of FIG. 44, there is not the parasitic transistor Bip2. Therefore, the problem of increased ON resistance when the electron current increases can be prevented.

Similar effects can be obtained by combining the above described embodiments. Similar effects can be also obtained when the conductivity types of each of the above described embodiments are reversed.

In each of the embodiments above, the p type isolation region 5 is formed in contact with the lower surface of field oxide film 14 as an example of a preferred structure. However, it is not limited to this structure, and the above described effects can be obtained even if there is not a field oxide film 14.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A high breakdown voltage type semiconductor device, comprising:
   a semiconductor layer of a first conductivity type;
   a low concentration impurity region of a second conductivity type formed at a prescribed position of said semiconductor layer;
   a first main electrode region of the second conductivity type formed spaced from an end portion of said low concentration impurity region of the second conductivity type to provide a channel region;
   a control electrode formed above said channel region and on said semiconductor layer with an insulating film therebetween, and extending over a part of an upper surface of said low concentration impurity region of said second conductivity type;
   an impurity region of the first conductivity type formed on the surface of said semiconductor layer to be in contact with said first main electrode region on a side of said first main electrode region opposing to said channel region;

a first main electrode provided on said semiconductor layer and said control electrode with an insulating film interposed and on said first main electrode region and said impurity region of the first conductivity type;

a second main electrode region formed on another side of said low concentration impurity region of the second conductivity type at the surface of said semiconductor substrate to be in contact with said low concentration impurity region of the second conductivity type; and a second main electrode provided on said semiconductor layer with an insulating film interposed and on said second main electrode region; wherein the width of said channel region at a corner portion is made wider than the width of the channel region at a linear portion, in plan view of said semiconductor device.

2. The high breakdown voltage type semiconductor device according to claim 1, wherein said low concentration impurity region of the second conductivity type is formed to be in contact with a field insulating film formed at the surface of said semiconductor layer.

3. The high breakdown voltage type semiconductor device according to claim 1, wherein said impurity region of the first conductivity type is formed to cover said first main electrode region.

4. A high breakdown voltage type semiconductor device, comprising:

a semiconductor layer of a first conductivity type;

a low concentration impurity region of a second conductivity type formed at a prescribed position of said semiconductor layer;

a first main electrode region of the second conductivity type formed at a surface of said semiconductor layer spaced from an end portion of said low concentration impurity region of the second conductivity type to provide a channel region;

a control electrode formed above said channel region and on the surface of said semiconductor layer with an insulating film interposed therebetween and extending over a part of an upper surface of low concentration impurity region of the second conductivity type;

an impurity region of the first conductivity type formed at the surface of said semiconductor layer to be in contact with said first main electrode region, on a side of said first main electrode region opposing to said channel region;

a first main electrode formed on said semiconductor layer and said control electrode with an insulating film interposed, and on said first main electrode region and said impurity region of the first conductivity type;

a second main electrode region of the second conductivity type formed to be in contact with said low concentration impurity region of the second conductivity type at another side of said low concentration impurity region of the second conductivity type at the surface of said semiconductor layer;

an impurity diffused region of the first conductivity type formed in said second main electrode region; and a second main electrode formed on said semiconductor layer and said second main electrode region with an insulating film interposed and on said impurity diffused region.

5. The high breakdown voltage type semiconductor device according to claim 4, wherein said low concentration impurity region of the second conductivity type is formed to be in contact with a lower surface of a field insulating film formed at the surface of said semiconductor layer.

6. A high breakdown voltage type semiconductor device, comprising:

a semiconductor layer of a first conductivity type;

a low concentration impurity region of a second conductivity type formed at a prescribed position of said semiconductor layer;

a first main electrode region formed on one side of said low concentration impurity region of the second conductivity type at a surface of said semiconductor layer spaced from an end portion of said low concentration impurity region of the second conductivity type to provide a channel region;

a control electrode formed above said channel region and on the surface of said semiconductor layer with an insulating film interposed therebetween and extending over a part of an upper surface of said low concentration impurity region of the second conductivity type;

an impurity region of the first conductivity type formed at the surface of said semiconductor layer on a side of said first main electrode region opposing to said channel region, to be in contact with said first main electrode region;

a first main electrode formed on said semiconductor layer and said control electrode with an insulating film interposed and on said first main electrode region and said impurity region of the first conductivity type;

a second main electrode region formed on another side of said low concentration impurity region of the second conductivity type at the surface of said semiconductor layer, to be in contact with the low concentration impurity region of said second conductivity type;

an impurity diffused region of the first conductivity type formed in said second main electrode region; and a second main electrode formed on said semiconductor layer with an insulating film interposed and on said second main electrode region and said impurity diffused region.

* * * * *